US008967082B2

(12) United States Patent
Iwasaki et al.

(10) Patent No.: US 8,967,082 B2
(45) Date of Patent: Mar. 3, 2015

(54) PLASMA PROCESSING APPARATUS AND GAS SUPPLY DEVICE FOR PLASMA PROCESSING APPARATUS

(75) Inventors: Masahide Iwasaki, Amagasaki (JP); Toshihisa Nozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 303 days.

(21) Appl. No.: 13/496,540

(22) PCT Filed: Sep. 14, 2010

(86) PCT No.: PCT/JP2010/065847
§ 371 (c)(1),
(2), (4) Date: Apr. 10, 2012

(87) PCT Pub. No.: WO2011/034057
PCT Pub. Date: Mar. 24, 2011

(65) Prior Publication Data
US 2012/0186521 A1 Jul. 26, 2012

(30) Foreign Application Priority Data

Sep. 17, 2009 (JP) .................................. 2009-215611

(51) Int. Cl.
*C23C 16/00* (2006.01)
*C23F 1/00* (2006.01)
(Continued)

(52) U.S. Cl.
CPC .... *H01L 21/02274* (2013.01); *C23C 16/45517* (2013.01); *C23C 16/45536* (2013.01);
(Continued)

(58) Field of Classification Search
CPC .................. C23C 16/45517; C23C 16/45565; H01J 37/3244

USPC ......... 118/715, 723 MW; 156/345.33, 345.41
See application file for complete search history.

(56) References Cited

U.S. PATENT DOCUMENTS 5,304,250 A * 4/1994 Sameshima et al. .... 118/723 ER
5,445,699 A * 8/1995 Kamikawa et al. ...... 156/345.24
(Continued)

FOREIGN PATENT DOCUMENTS

| CN | 101218860 A | 7/2008 |
| CN | 101523576 A | 9/2009 |

(Continued)

OTHER PUBLICATIONS

International Search Report for PCT/JP2010/065847 dated Dec. 7, 2010.
(Continued)

*Primary Examiner* — Rakesh Dhingra
(74) *Attorney, Agent, or Firm* — Pearne & Gordon LLP

(57) ABSTRACT

A plasma processing apparatus 31 includes a processing chamber 32; a gas supply unit 33 for supplying a plasma processing gas into a processing chamber 32; a mounting table 34 configured to hold the target substrate W thereon; a plasma generating device 39 configured to generate plasma within the processing chamber 32; and a gas supply device 61. The gas supply device 61 includes a head unit 62 configured to move between a first position above the mounting table 34 and a second position different from the first position and to supply a gas, and the head unit 62 is configured to supply a film forming gas to a small-volume region formed between the mounting table 34 and the head unit 62 when the head unit 62 is positioned at the first position and to adsorb the film forming gas on the target substrate W.

12 Claims, 18 Drawing Sheets

(51) Int. Cl.
*H01L 21/306* (2006.01)
*H01L 21/02* (2006.01)
*C23C 16/455* (2006.01)
*H01L 21/28* (2006.01)

(52) U.S. Cl.
CPC ...... *H01L21/02164* (2013.01); *H01L 21/0217* (2013.01); *H01L 21/0228* (2013.01); *H01L 21/28194* (2013.01)
USPC ............ 118/723 MW; 118/715; 156/345.33; 156/345.41

(56) References Cited

U.S. PATENT DOCUMENTS

| | | | | |
|---|---|---|---|---|
| 6,042,687 | A * | 3/2000 | Singh et al. | 156/345.33 |
| 6,416,579 | B1 * | 7/2002 | Thallner | 118/323 |
| 2003/0075273 | A1 * | 4/2003 | Kilpela et al. | 156/345.33 |
| 2004/0250768 | A1 * | 12/2004 | Kikuchi et al. | 118/715 |
| 2005/0205015 | A1 * | 9/2005 | Sasaki et al. | 118/723 MA |
| 2006/0169207 | A1 * | 8/2006 | Kobayashi et al. | 118/715 |
| 2006/0213444 | A1 * | 9/2006 | Samukawa et al. | 118/723 ME |
| 2007/0218701 | A1 | 9/2007 | Shimizu et al. | |
| 2008/0017613 | A1 * | 1/2008 | Nogami et al. | 216/58 |
| 2008/0127892 | A1 * | 6/2008 | Kim | 118/712 |
| 2009/0065147 | A1 | 3/2009 | Morita | |
| 2010/0029093 | A1 | 2/2010 | Shiozawa et al. | |

FOREIGN PATENT DOCUMENTS

| | | |
|---|---|---|
| JP | 05-090210 A | 4/1993 |
| JP | 08-260154 A | 10/1996 |
| JP | 2001-279450 A | 10/2001 |
| JP | 2007-247066 A | 9/2007 |
| KR | 10-2009-0058002 A | 6/2009 |
| WO | 2008/041601 A1 | 4/2008 |

OTHER PUBLICATIONS

Verghese, et al., "Atomic Layer Deposition: Enabling Advanced High-κ and Metal Films", ASM Semi Mfg China ALd Article, May 15, 2008.

* cited by examiner

PLASMA PROCESSING APPARATUS AND GAS SUPPLY DEVICE FOR PLASMA PROCESSING APPARATUS

CROSS-REFERENCE TO RELATED APPLICATION

This Application is a U.S. national phase application under 35 U.S.C. §371 of PCT Application No. PCT/JP2010/065847 filed on Sep. 14, 2010, which claims the benefit of Japanese Patent Application No. 2009-215611 filed on Sep. 17, 2009, the entire disclosures of which are incorporated herein by reference.

TECHNICAL FIELD

The present disclosure relates to a plasma processing apparatus and a gas supply device for the plasma processing apparatus and, more particularly, to a plasma processing apparatus used for fabricating a semiconductor device and a gas supply device for the plasma processing apparatus.

BACKGROUND ART

Conventionally, when forming an insulating layer having a high pressure resistance property or an excellent leak property against a gate oxide film of a semiconductor device represented as a LSI (Large Scale Integrated Circuit) or a CCD (Charge Coupled Device) and a MOS (Metal Oxide Semiconductor) transistor, a thermal CVD (Chemical Vapor Deposition) method is generally used. However, if a silicon oxide film having a high insulation property is formed by the thermal CVD method, a silicon substrate needs to be exposed to high temperature. In this case, if a conductive layer is formed on the silicon substrate by using a material having a relatively low melting point, such as metal having a low melting point, or a high molecular compound, the metal having a low melting point may be melted.

Recently, as devices become highly integrated, there is required a high-quality film property having a good step coverage or uniformity against a three-dimensional structure and no impurities or physical defects within an insulating film and at an interface. As one of efficient methods for satisfying this requirement, an ALD (Atomic Layer Deposition) method has been known. In the ALD method, a reactant gas in an atomic unit is supplied regularly to a surface of a substrate to form a film, and a film thickness is controlled with high accuracy. However, as compared to a property of a film formed by the thermal CVD, a property of a film formed by the ALD method has bad pressure resistance property or bad leak property. As a method for solving these problems and efficiently forming a high-quality film, a PE-ALD (Plasma-Enhanced ALD) method has drawn attention (May 15, 2008 ASM Semi Mfg China ALD Article.pdf (Non-Patent Document 1)).

Non-Patent Document 1: May 15, 2008 ASM Semi Mfg China ALD Article.pdf

DISCLOSURE OF THE INVENTION

Problems to be Solved by the Invention

A PE-ALD method is carried out in sequence of the following processes (1) to (3). That is, the PE-ALD method includes (1) a process of supplying a first gas containing atoms that form a thin film to a surface of a substrate or an underlying film and chemically adsorbing the first gas thereon; (2) a process of removing a remaining gas that is physically adsorbed in the process (1); and (3) a process of forming a required thin film through a plasma process using a second gas containing the atoms that form the thin film.

In this case, there is a problem that requirement for a processing chamber used in the processes (1) and (2) is different from requirement in the process (3). In the PE-ALD method, a throughput increase is one of important requirements for development of apparatuses.

To be specific, in the processes (1) and (2), a gas substitution property is important. By way of example, when a gas is supplied to a substrate and chemically adsorbed, an internal pressure of a processing chamber needs to be increased to a certain level in order to adsorb and saturate the gas. In these processes, if a pressure difference between before and after increasing the pressure within the processing chamber is denoted as $\Delta P$, a supply flow rate of the gas is denoted as Q, a volume of the processing chamber is denoted as V, and a time required for increasing the pressure is denoted as t, a relationship thereof can be expressed as $t=\Delta P \times V/Q$.

If $\Delta P$ is constant, it is efficient to increase the supply flow rate (Q) of the gas in order to reduce the time (t). However, it is not desirable because a consumption amount of the supplied gas as a source material becomes increased to thereby increase a running cost.

In the process of removing the remaining gas that is physically adsorbed, the gas needs to be exhausted and substituted in a certain pressure condition. Herein, if an initial pressure within the processing chamber is denoted as $P_0$, a target pressure is denoted as $P_1$, a volume of the processing chamber is denoted as V, an exhaust flow rate is denoted as S, and a time is denoted as t, a relationship thereof can be expressed as $P_1=P_0 \times \exp(-(S/V)t)$.

If the initial pressure ($P_0$) and the target pressure ($P_1$) are constant, it is efficient to increase the exhaust flow rate (S) in order to reduce the time (t). However, it is not desirable because a high-speed and high-capacity pump is needed to increase the exhaust flow rate (S), and thereby an apparatus cost or an apparatus size becomes increased.

Accordingly, in either case, it is efficient to reduce the volume (V) of the processing chamber in order to reduce the time (t).

However, in the process (3), to generate plasma of high quality, the processing chamber needs to have a volume greater than a certain level in consideration of plasma ignition property, electric discharge stability, and damage on the substrate. That is, there is a limit in reducing the volume of the processing chamber.

Since the supply of the gas and the plasma process are carried out in the same processing chamber, films of the same number as a total number of processed substrates are formed on an inner wall surface of the processing chamber, or reaction products adhere to the inner wall surface. Such reaction products are peeled off from the inner wall surface and become a cause of particles. Therefore, the processing chamber needs to be cleaned regularly. Thus, it is not desirable in view of production efficiency.

Illustrative embodiments provide a plasma processing apparatus capable of efficiently forming a high-quality film. Illustrative embodiments also provide a gas supply device for the plasma processing apparatus capable of efficiently forming a high-quality film.

Means for Solving the Problems

In accordance with one aspect of illustrative embodiments, there is provided a plasma processing apparatus. The plasma processing apparatus includes a processing chamber for performing therein a plasma process on a target substrate; a mounting table provided within the processing chamber and configured to hold the target substrate thereon; a plasma generating device configured to generate plasma within the processing chamber; and a gas supply device including a head unit configured to move between a first position above the mounting table and a second position different from the first position and to supply a gas. The processing chamber includes a bottom portion positioned at a lower side and a sidewall extended upwards from an outer periphery of the bottom portion and is configured to be airtightly sealed. Further, the head unit is configured to supply a film forming gas to a small-volume region formed between the mounting table and the head unit when the head unit is positioned at the first position and to adsorb the film forming gas on the target substrate.

With this configuration, it is possible to supply the film forming gas into the small-volume region formed between the mounting table and the head unit when the film forming gas is adsorbed on the target substrate. Thus, it is possible to reduce a supply amount of the film forming gas. Further, during the film forming process, a pressure is controlled not in the whole processing chamber of a large volume but in the small-volume region at a low flow rate. Thus, a time for controlling the pressure can be reduced. Therefore, it is possible to form a film efficiently. Furthermore, during the plasma process, an inner wall surface of the processing chamber is not exposed to the film forming gas. Therefore, it is possible to prevent a reaction product from adhering to the inner wall surface of the processing chamber. Thus, it is possible to reduce the number of processes for cleaning the inner wall surface of the processing chamber. Further, it is possible to prevent particles from being generated. In this plasma processing apparatus, it is possible to form a high-quality film efficiently.

Desirably, the head unit may include a circular plate having a substantially circular shape. Further, when the head unit is positioned at the first position, the circular plate may cover an upper side of the mounting table.

Further, the head unit may include a rod-shaped member extended in a horizontal direction within the processing chamber, and the rod-shaped member may be configured to be moved in a horizontal direction above the target substrate held on the mounting table.

More desirably, in the gas supply device, the head unit may include gas supply holes formed so as to face the target substrate held on the mounting table and configured to supply the film forming gas when the head unit is positioned at the first position.

More desirably, the gas supply device may further include a gas exhaust device configured to exhaust the small-volume region formed between the head unit and the mounting table when the head unit is positioned at the first position.

Further, in the gas exhaust device, the head unit may include a gas exhaust hole formed so as to face the target substrate held on the mounting table and configured to exhaust the small-volume region formed between the head unit and the mounting table when the head unit is positioned at the first position.

Further, desirably, when the head unit is positioned at the first position, a volume of the small-volume region formed between the head unit and the mounting table may be about 50% or less of an entire volume of the processing chamber.

More desirably, head unit may be configured to be moved in at least one of a vertical direction and a horizontal direction.

More desirably, the gas supply device may further include a supporting member that is extended from the sidewall and supports the head unit at a connection portion between an inner end portion of the supporting member and the head unit.

Further, a temperature control unit may be configured to control temperatures of the head unit and the supporting member.

Furthermore, the gas supply device may further include a supporting member that is extended from the sidewall and supports the head unit at a connection portion between an inner end portion of the supporting member and the head unit. The gas exhaust device may include a gas exhaust path, formed within the supporting member, serving as a path for an exhausted gas. The gas supply device may further include a gas supply path, formed within the supporting member, serving as a path for a gas to be supplied. The gas supply path and the gas exhaust path may be formed in a multiple structure where the gas supply path is arranged inside the gas exhaust path.

Moreover, the plasma processing apparatus may further include a target substrate moving unit for, at least one of, supporting the target substrate on the mounting table and separating the target substrate held on the mounting table.

Further, the head unit may be configured to be rotated around an outer end portion of the supporting member.

More desirably, the processing chamber may be provided with a receiving unit formed by extending a part of the sidewall toward the outside and configured to accommodate therein the head unit.

The plasma processing apparatus may further include a shielding member configured to shield an inner region of the receiving unit from an outer region of the receiving unit.

Further, the shielding member may include a shielding plate capable of moving along an inner wall surface of the sidewall.

The processing chamber may further include a first processing chamber and a second processing chamber different from the first processing chamber, and the head unit may be configured to be moved between the first processing chamber and the second processing chamber.

More desirably, the mounting table may be configured to be moved in at least one of a vertical direction and a horizontal direction.

More desirably, the plasma generating device may include a microwave generator that generates microwave for plasma excitation; and a dielectric window that is positioned to face the mounting table and configured to introduce the microwave into the processing chamber.

More desirably, the plasma generating device may further include a slot antenna plate having a multiple number of slot holes. The slot antenna plate is provided above the dielectric window and configured to radiate the microwave to the dielectric window.

In accordance with another aspect of the illustrative embodiments, there is provided a gas supply device for supplying a processing gas in a plasma processing apparatus. Here, the plasma processing apparatus includes: a processing chamber for performing therein a plasma process on a target substrate; a mounting table provided within the processing chamber and configured to hold the target substrate thereon; and a plasma generating device configured to generate plasma within the processing chamber. The processing chamber has a bottom portion positioned at a lower side and a sidewall extended upwards from an outer periphery of the bottom portion, and is configured to be airtightly sealed. The gas supply device includes a head unit configured to move between a first position above the mounting table and a second position different from the first position and to supply a gas. Further, the head unit is configured to supply a film forming gas to a small-volume region formed between the mounting table and the head unit when the head unit is positioned at the first position and to adsorb the film forming gas on the target substrate.

In accordance with the gas supply device for the plasma processing apparatus, it is possible to form a high-quality film efficiently.

Desirably, the gas supply device may further include a gas exhaust hole that is formed so as to face the target substrate held on the mounting table and configured to exhaust the small-volume region formed between the mounting table and the head unit when the head unit is positioned at the first position.

Effect of the Invention

In accordance with the plasma processing apparatus, it is possible to supply a film forming gas into a small-volume region formed between a mounting table and a head unit when the film forming gas is adsorbed on a target substrate. Thus, it is possible to reduce a supply amount of the film forming gas. Further, during the film forming process, a pressure is controlled not in the whole processing chamber of a large volume but in the small-volume region at a low flow rate. Thus, a time for controlling the pressure can be reduced. Therefore, it is possible to form a film efficiently. Furthermore, during the plasma process, an inner wall surface of the processing chamber is not exposed to the film forming gas. Therefore, it is possible to prevent reaction products from adhering to the inner wall surface of the processing chamber. Thus, it is possible to reduce the number of processes for cleaning the inner wall surface of the processing chamber. Further, it is possible to prevent particles from being generated. In this plasma processing apparatus, it is possible to form a high-quality film efficiently.

Further, in accordance with the gas supply device for the plasma processing apparatus, it is possible to form a high-quality film efficiently.

BEST MODE FOR CARRYING OUT THE INVENTION

Figure 1:
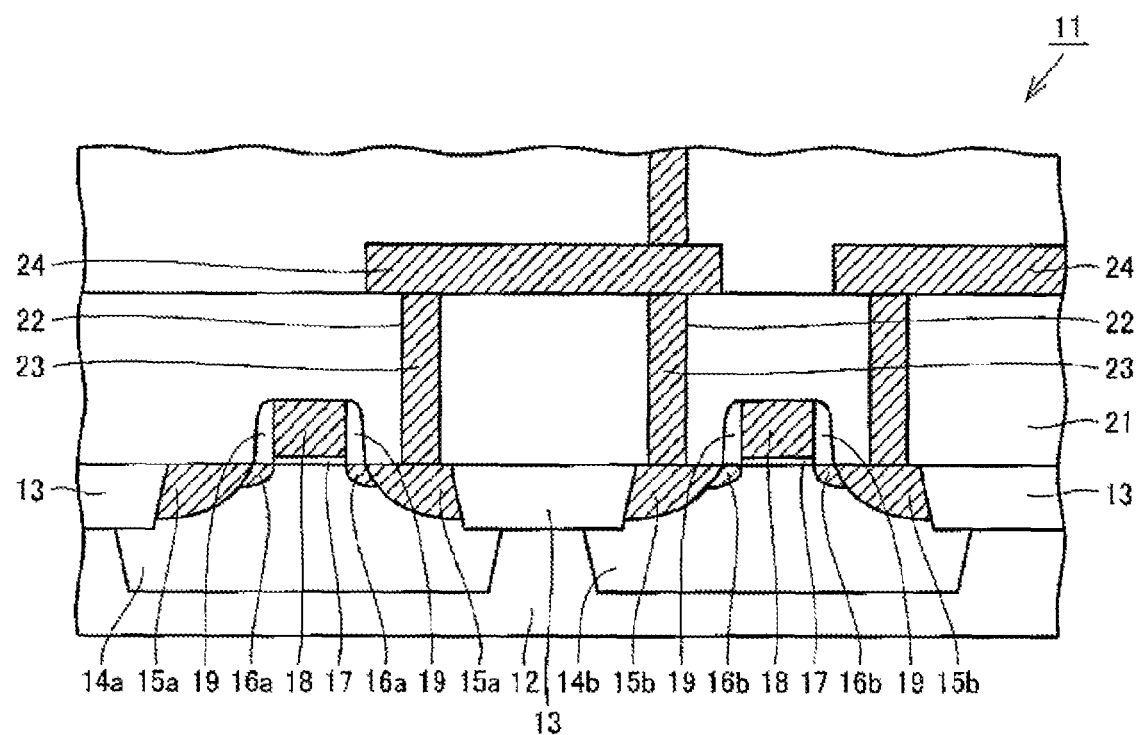
FIG. 1 is a schematic cross sectional view illustrating a part of a MOS-type semiconductor device.

Hereinafter, illustrative embodiments will be described with reference to the accompanying drawings. A semiconductor device manufactured by a plasma processing apparatus in accordance with an illustrative embodiment will be explained. FIG. 1 is a schematic cross sectional view illustrating a part of a MOS-type semiconductor device manufactured by a plasma processing apparatus in accordance with the illustrative embodiment. In FIG. 1, a conductive layer of the MOS-type semiconductor device is hatched.

Referring to FIG. 1, a MOS-type semiconductor device 11 includes a silicon substrate 12 on which device isolation regions 13, p-wells 14a, n-wells 14b, high-concentration n-type impurity diffusion regions 15a, high-concentration p-type impurity diffusion regions 15b, n-type impurity diffusion regions 16a, p-type impurity diffusion regions 16b, and gate oxide films 17 are provided. One of the high-concentration n-type impurity diffusion regions 15a and the high-concentration p-type impurity diffusion regions 15b provided with the gate oxide films 17 therebetween serves as a drain, and the other one serves as a source.

Gate electrodes 18 formed of a conductive layer are provided on the gate oxide films 17, and gate sidewalls 19 formed of insulating films are provided at side portions of the gate electrodes 18. On the silicon substrate 12 on which the gate electrodes 18 are provided, insulating films 21 are provided. In the insulating films 21, contact holes connected to the high-concentration n-type impurity diffusion regions 15a and the high-concentration p-type impurity diffusion regions 15b are formed. Within the contact holes 22, embedded electrodes 23 are provided. On the contact holes 22, metal wiring layers 24 formed conductive layers are provided. Further, interlayer insulating films (not shown) formed as insulating layers and metal wiring layers formed as conductive layers are provided alternately and finally, pads (not shown) as contact points with the outside are provided. The MOS-type semiconductor device 11 is configured as described above.

The semiconductor device manufactured by the plasma processing apparatus in accordance with the present illustrative embodiment includes silicon oxide films serving as, for example, the gate oxide films 17. As will be described below, the silicon oxide film is formed by adsorbing a film forming gas on a target substrate and performing a plasma process thereon. Further, the insulating film formed by the plasma processing apparatus in accordance with the present illustrative embodiment is the silicon oxide film serving as the gate oxide film. The insulating film is formed by adsorbing a film forming gas on the target substrate and performing a plasma process thereon.

Hereinafter, a configuration and an operation of a plasma processing apparatus in accordance with the present illustrative embodiment will be explained.

Figure 2:
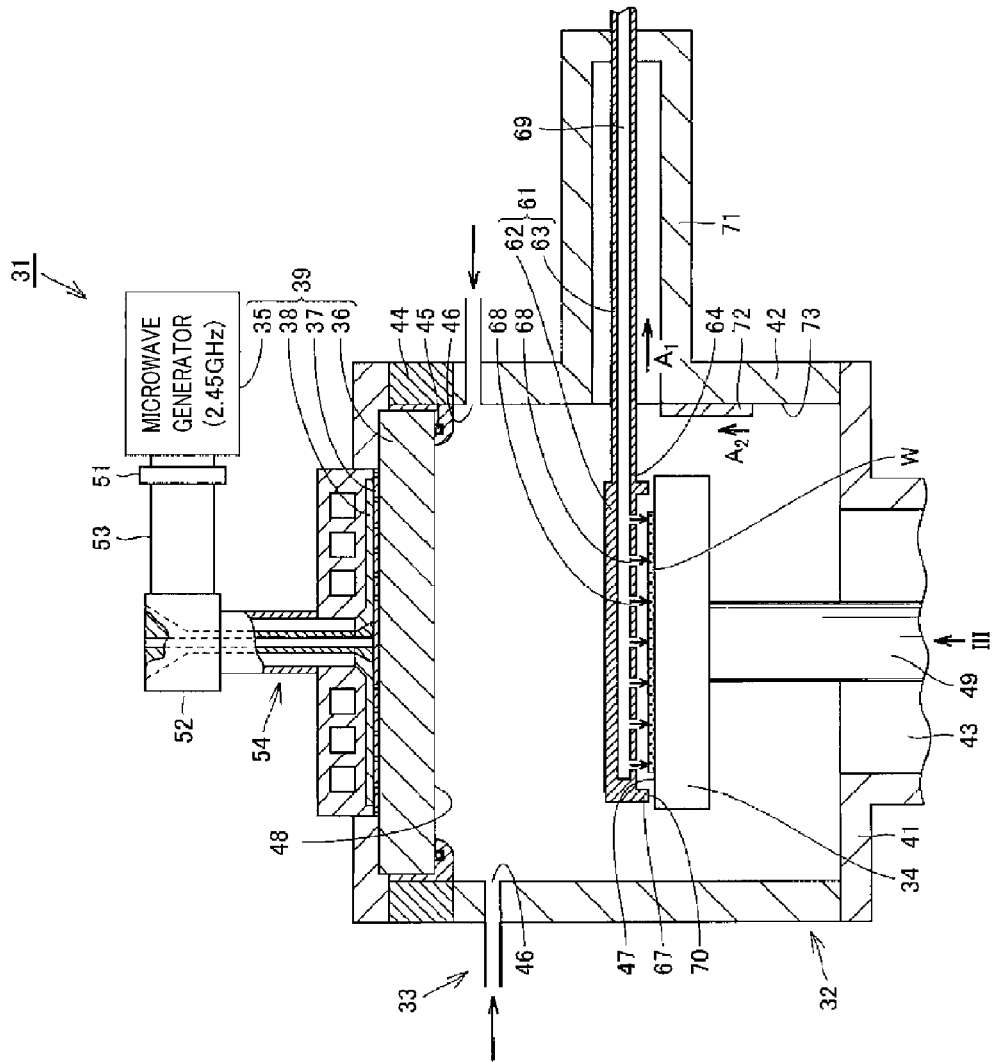
FIG. 2 is a schematic cross sectional view illustrating major components of a plasma processing apparatus in accordance with an illustrative embodiment.
Figure 3:
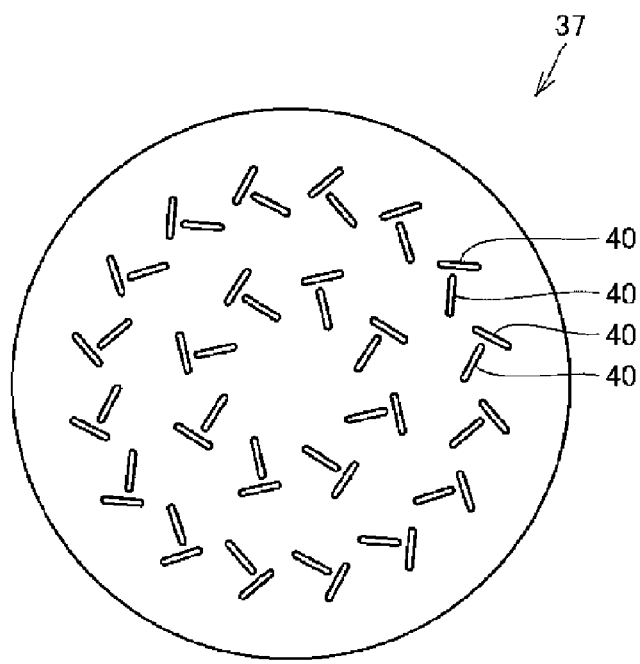
FIG. 3 illustrates a slot antenna plate provided in the plasma processing apparatus of FIG. 2 when viewed in a plate-thickness direction.

FIG. 2 is a schematic cross sectional view illustrating major components of a plasma processing apparatus in accordance with the present illustrative embodiment. FIG. 3 illustrates a slot antenna plate provided in the plasma processing apparatus of FIG. 2 when viewed from a lower side, i.e., from a direction of an arrow III of FIG. 2. In FIG. 2, hatching for some components is omitted for easy understanding.

Referring to FIGS. 2 and 3, a plasma processing apparatus 31 includes a processing chamber 32; a plasma processing gas supply unit 33; a circular plate-shaped mounting table 34; a plasma generating device 39; and a control unit (not shown). A plasma process is performed on a target substrate W in the processing chamber 32, and the plasma processing gas supply unit 33 is configured to supply a reactant gas for a plasma process into the processing chamber 32. Further, the circular plate-shaped mounting table 34 is configured to mount thereon the target substrate W, and the plasma generating device 39 is configured to generate plasma within the processing chamber 32. Here, the control unit is configured to control an overall of the plasma processing apparatus 31. By way of example, the control unit controls a gas flow rate in the plasma processing gas supply unit 33, an internal pressure in the processing chamber 32, and the like.

The processing chamber 32 includes a bottom portion 41 positioned below the mounting table 34 and a sidewall 42 extended upwards from an outer periphery of the bottom portion 41. The sidewall 42 has a substantially cylindrical shape except a part thereof. In the bottom portion 41 of the processing chamber 32, an exhaust hole 43 for gas exhausting is formed through a part of the bottom portion 41. Upper portion of the processing chamber 32 is opened. The processing chamber 32 can be airtightly sealed by a cover 44 provided above the processing chamber 32, a dielectric window 36 to be described later, and an O-ring 45 as a sealing member provided between the dielectric window 36 and the cover 44.

At an upper portion of the sidewall 42, the plasma processing gas supply unit 33 includes, a multiple number of plasma processing gas supply holes 46 for supplying a plasma processing gas into the processing chamber 32. The plasma processing gas supply holes 46 are arranged at a regular interval along the periphery of the processing chamber 32. The plasma processing gas is supplied into the plasma processing gas supply unit 33 from a reactant gas supply source (not shown).

The mounting table 34 mounts thereon the target substrate W by means of an electrostatic chuck (not shown). Further, the mounting table 34 is configured to adjust a temperature thereof by means of a temperature control unit (not shown) provided therein. The mounting table 34 is supported by a cylindrical supporting member 49 extended vertically upwards from a lower side of the bottom portion 41. The cylindrical supporting member 49 has an insulating property. The exhaust hole 43 is formed through the part of the bottom portion 41 of the processing chamber 32 along the periphery of the cylindrical supporting member 49. The annular exhaust hole 43 is connected to an exhaust device (not shown) via an exhaust pipe (not shown) at its lower side. The exhaust device includes a vacuum pump such as a turbo molecular pump. The inside of the processing chamber can be depressurized to a certain level by the exhaust device.

The plasma generating device 39 includes a microwave generator 35 provided at an outside of the processing chamber 32; the dielectric window 36 positioned so as to face the mounting table 34; a slot antenna plate 37, provided above the dielectric window 36, having a multiple number of slot holes 40; a dielectric member 38 positioned above the slot antenna plate 37. The microwave generator 35 is configured to generate microwave for exciting plasma and the dielectric window 36 is configured to introduce the microwave generated by the microwave generator 35 into the processing chamber 32. Further, the slot antenna plate 37 is configured to radiate the microwave to the dielectric window 36 and the dielectric member 38 is configured to radially propagate the microwave introduced by a coaxial waveguide 54 to be described later.

The microwave generator 35 including a matching device 51 is connected to an upper part of the coaxial waveguide 54 configured to introduce the microwave via a mode converter 52 and a waveguide 53. By way of example, a TE mode microwave generated by the microwave generator 35 is converted into a TEM mode by the mode converter 52 after passing through the waveguide 53. Then, the TEM mode microwave passes through the coaxial waveguide 54. A frequency of the microwave generated by the microwave generator 35 is, for example, about 2.45 GHz.

The dielectric window 36 has a substantially circular plate shape and is made of a dielectric material. Further, the dielectric window 36 may be made of a material such as quartz or alumina.

The slot antenna plate 37 has a circular thin-plate shape. As for the elongated hole-shaped slot holes 40, a pair of the slot holes 40 is provided so as to be substantially orthogonal to each other as depicted in FIG. 3. Pairs of the slot holes 40 are arranged with a certain distance therebetween along the periphery of the slot antenna plate 37. Further, pairs of the slot holes 40 are arranged with a certain distance therebetween in a radial direction.

The microwave generated by the microwave generator 35 passes through the coaxial waveguide 54 and propagates the dielectric member 38. Then, the microwave is radiated to the dielectric window 36 from the slot holes 40 provided in the slot antenna plate 37. The microwave passing through the dielectric window 36 generates an electric field right below the dielectric window 36 so as to generate plasma within the processing chamber 32. That is, microwave plasma supplied for a process in the plasma processing apparatus 31 is generated by a radial line slot antenna (RLSA) including the above-described slot antenna plate 37 and the dielectric member 38.

Figure 4:
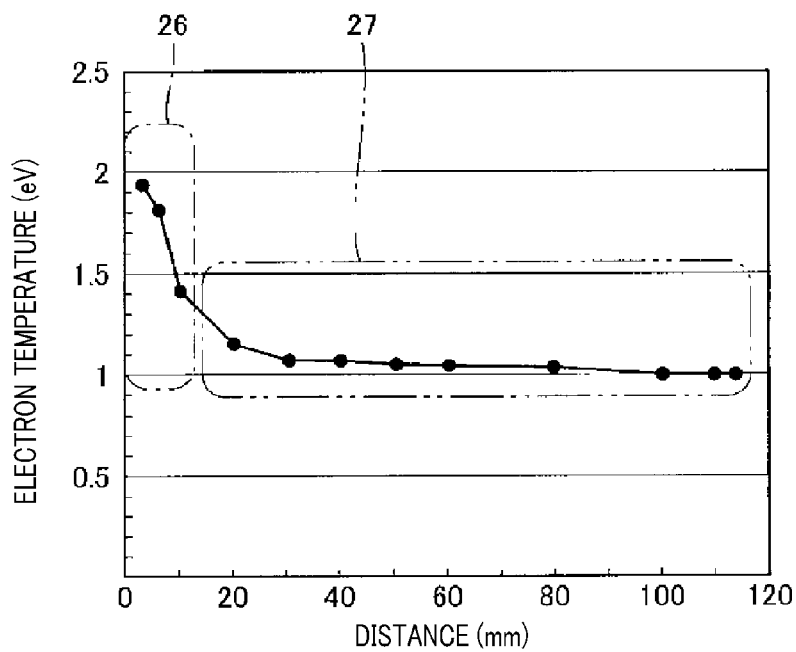
FIG. 4 is a graph showing a relationship between a distance from a bottom surface of a dielectric window and an electron temperature of plasma.
Figure 5:
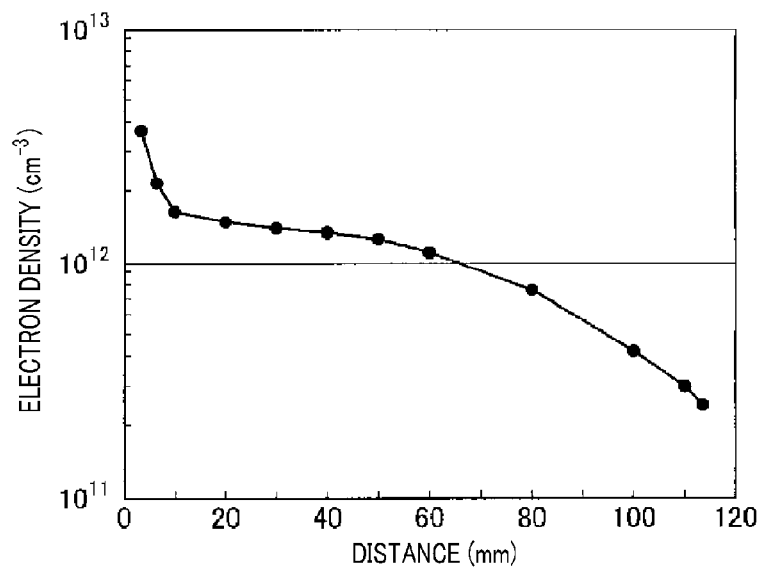
FIG. 5 is a graph showing a relationship between a distance from the bottom surface of the dielectric window and an electron density of plasma.

FIG. 4 is a graph showing a relationship between a distance from a bottom surface 48 of the dielectric window 36 in the processing chamber 32 and an electron temperature of plasma when plasma is generated in the plasma processing apparatus 31. FIG. 5 is a graph showing a relationship between a distance from the bottom surface 48 of the dielectric window 36 in the processing chamber 32 and an electron density of plasma when plasma is generated in the plasma processing apparatus 31.

Referring to FIGS. 4 and 5, a region right below the dielectric window 36, to be specific, a region 26 from the bottom surface 48 to about 10 mm height distanced therefrom, which is indicated by a dashed dotted line, is so called as "plasma generation region". In this region 26, an electron temperature is relatively high in a range of from about 1.5 eV to about 2.5 eV, and an electron density is greater than about $1\times10^{12}$ cm$^{-3}$. Meanwhile, a region 27 of far from about 10 mm, which is indicated by a dashed double-dotted line, is so called as "plasma diffusion region". In this region 27, an electron temperature is in a range of from about 1.0 eV to about 1.3 eV, i.e., at least lower than 1.5 eV, and an electron density is about $1\times10^{12}$ cm$^{-3}$, at least greater than about $1\times10^{11}$ cm$^{-3}$. Within the processing chamber 32 of the plasma processing apparatus 31, the plasma processing gas is excited into plasma by microwave having the above conditions. A plasma process to be described later is performed on the target substrate W in the plasma diffusion region. That is, the plasma process is performed by using microwave plasma having an electron temperature of lower than about 1.5 eV and an electron density of greater than about $1\times10^{11}$ cm$^{-3}$.

Herein, the plasma processing apparatus 31 includes a gas supply device 61 having a head unit 62 and a supporting member 63. The head unit 62 is configured to be movable between a first position above the mounting table 34 and a second position different from the first position and supply a film forming gas. The supporting member 63 is extended from the sidewall 42 of the processing chamber 32 and an inner end portion of the supporting member 63 is connected to the head unit 62. Thus, the supporting member 63 is configured to support the head unit 62 at the inner end portion. The gas supply device 61 supplies a film forming gas to a small-volume region formed between the head unit 62 and the mounting table 34, and the film forming gas is adsorbed on the target substrate W. The first and second positions will be described later. Further, the small-volume region indicates a small region between the head unit 62 and the mounting table 34, which has a small volume as compared with a large volume of the whole processing chamber 32.

Figure 6:
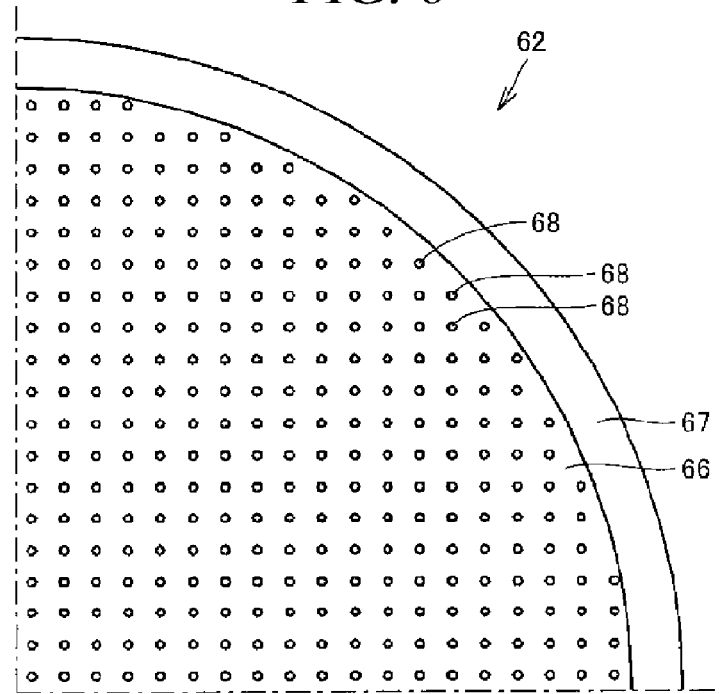
FIG. 6 illustrates a part of a head unit provided in the plasma processing apparatus of FIG. 2 when viewed in a direction of an arrow III of FIG. 2.
Figure 7:
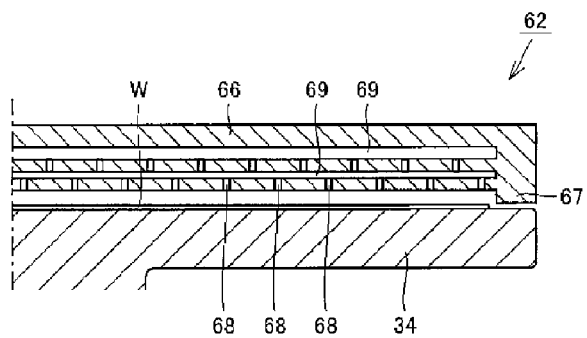
FIG. 7 is a cross sectional view illustrating a part of the head unit of FIG. 6.

Hereinafter, a detailed configuration of the head unit 62 provided in the gas supply device 61 will be described. FIG. 6 illustrates a part of the head unit 62s when viewed in a direction of the arrow III of FIG. 2. FIG. 7 is a cross sectional view illustrating a part of the head unit 62 illustrated in FIG. 6.

Referring to FIGS. 6 and 7, the head unit 62 includes a circular plate 66 having a circular thin-plate shape; and an annular extension member 67 extended in a plate-thickness direction from an outer periphery of the circular plate 66. To be specific, the extension member 67 is formed in a substantially cylindrical shape and extended downwards. The circular plate 66 has a diameter greater than the target substrate W. In this case, the first position refers to a position where the circular plate 66 covers an upper side of the mounting table 34. At the first position, an outer peripheral upper surface 47 of the mounting table 34 faces a bottom surface 70 of the extension member 67.

The head unit 62 includes gas supply holes 68 provided to face the target substrate W that is mounted on the mounting table 34 when the head unit 62 is positioned at the first position, i.e., above the mounting table 34. The gas supply holes 68 are configured to supply the film forming gas. The gas supply holes 68 are plural in number so that a part of a surface below the circular plate 66 of the head unit 62 can be opened. The gas supply holes 68 are arranged away from one another with substantially the same interval therebetween in longitudinal and transverse directions in FIG. 6.

Within the head unit 62 and the supporting member 63, a gas supply path 69 is formed. One end of the gas supply path 69 is connected to the gas supply holes 68 and the other end thereof is connected to a gas supply unit (not shown). The gas supply unit is provided at the outside of the processing chamber 32 and configured to supply the film forming gas. The film forming gas is supplied from the outside of the processing chamber 32 on the target substrate W via the gas supply path 69 and the gas supply holes 68.

The processing chamber 32 provided in the plasma processing apparatus 31 includes a receiving unit 71 formed by extending a part of the sidewall 42 toward the outside and configured to accommodate therein the head unit 62. The receiving unit 71 is extended straightly toward the outside from the part of the sidewall 42. A region within the receiving unit 71 serves as the second position to which the head unit 62 of the plasma processing apparatus 31 depicted in FIG. 2 can be moved.

Figure 8:
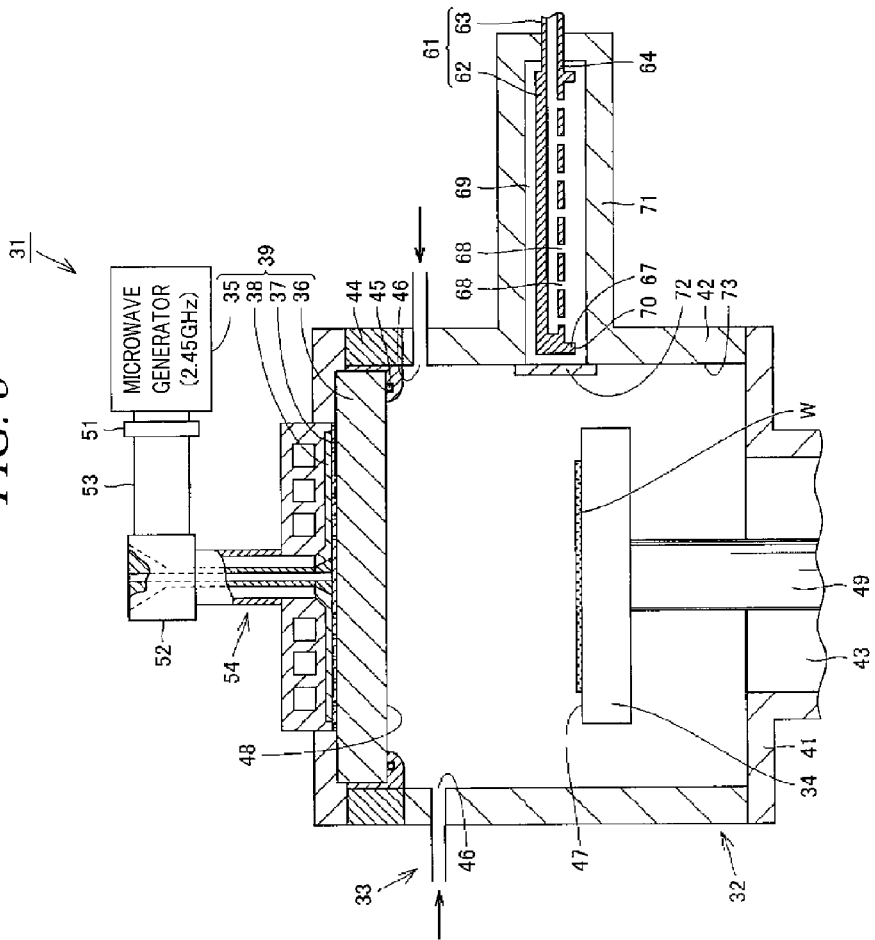
FIG. 8 is a schematic cross sectional view illustrating a status where the head unit is received in a receiving unit in the plasma processing apparatus of FIG. 2.

As stated above, the head unit 62 can move between the first position above the mounting table 34 and the second position within the receiving unit 71. That is, the head unit 62 can move in a direction indicated by an arrow $A_1$ of FIG. 2 or in the opposite direction. FIG. 2 illustrates a case where the head unit 62 is positioned at the first position, and FIG. 8 illustrates a case where the head unit 62 is positioned at the second position. FIG. 8 is a schematic cross sectional view illustrating a status where the head unit 62 is accommodated in the receiving unit 71 in the plasma processing apparatus 31 of FIG. 2.

The plasma processing apparatus 31 further includes a shielding plate 72 configured to shield an inner region of the receiving unit 71 from an outer region of the receiving unit 71, i.e., a region of the processing chamber 32 herein. The shielding plate 72 can move along an inner wall surface 73 of the sidewall 42 in a direction indicated by an arrow $A_2$ of FIG. 2 or in the opposite direction. FIG. 8 illustrates a case where the inner region of the receiving unit 71 is shielded from the outer region of the receiving unit 71.

Figure 9:
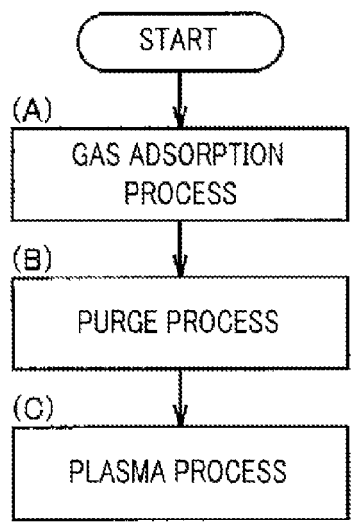
FIG. 9 is a flowchart showing a representative process for forming a film in the plasma processing apparatus of FIG. 2.

Hereinafter, a method of manufacturing a semiconductor device including an insulating film by using the plasma processing apparatus 31 will be explained by reference to FIGS. 1 to 9 and the following table 1. FIG. 9 is a flowchart showing a representative process for forming a film on a target substrate by using the plasma processing apparatus of FIG. 2. Table 1 shows a flow of the process and conditions of the process. During a plasma process to be described later, a temperature of the mounting table 34 is selected from a range of, for example, from about 100° C. to about 600° C., desirably from about 300° C. to about 400° C.

TABLE 1

| Step | (A) | (B) | (C) |
| --- | --- | --- | --- |
| Process | Gas adsorption process | Purge process | Plasma process |
| Pressure (Torr) | 3 | 1 | 1 |
| Ar gas flow rate (sccm) | 500 | 500 | 500 |
| $O_2$ gas flow rate (sccm) | 0 | 60 | 60 |
| Precursor gas flow rate (sccm) | 100 | 0 | 0 |
| Microwave output (kW) | 0 | 0 | 3 |

Referring to Table 1 and FIGS. 1 to 9, the target substrate W forming a semiconductor device is held on the mounting table 34 by means of an electrostatic chuck.

Then, a film forming gas is adsorbed on the target substrate W (step (A) of FIG. 9). To be specific, the process is as follows. The head unit 62 is moved to the first position, i.e., above the mounting table 34 on which the target substrate W is held. Thereafter, an internal pressure of the small-volume region formed between the mounting table 34 and the head unit 62 is controlled to be as shown in step (A) of Table 1.

Figure 10:
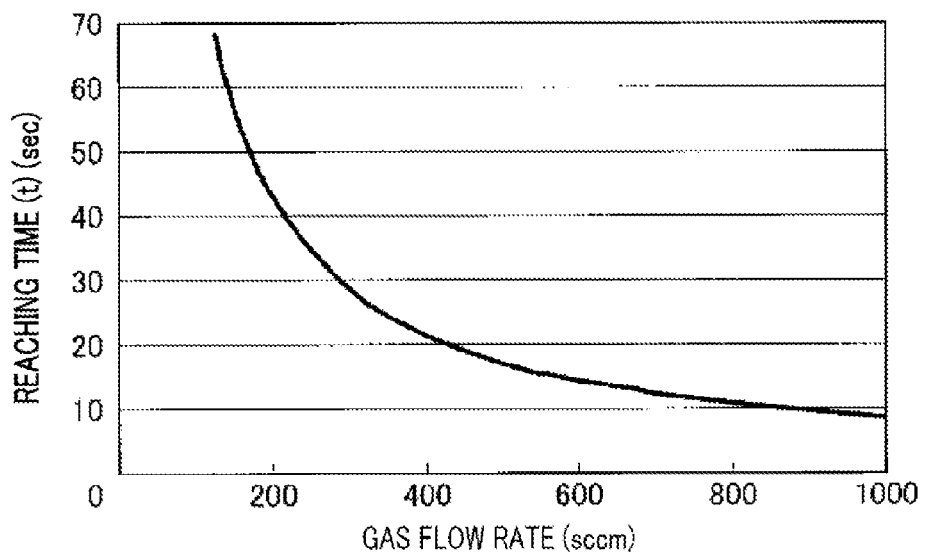
FIG. 10 is a graph showing a relationship between a gas flow rate in an entire of the processing chamber and a time for reaching a certain pressure.
Figure 11:
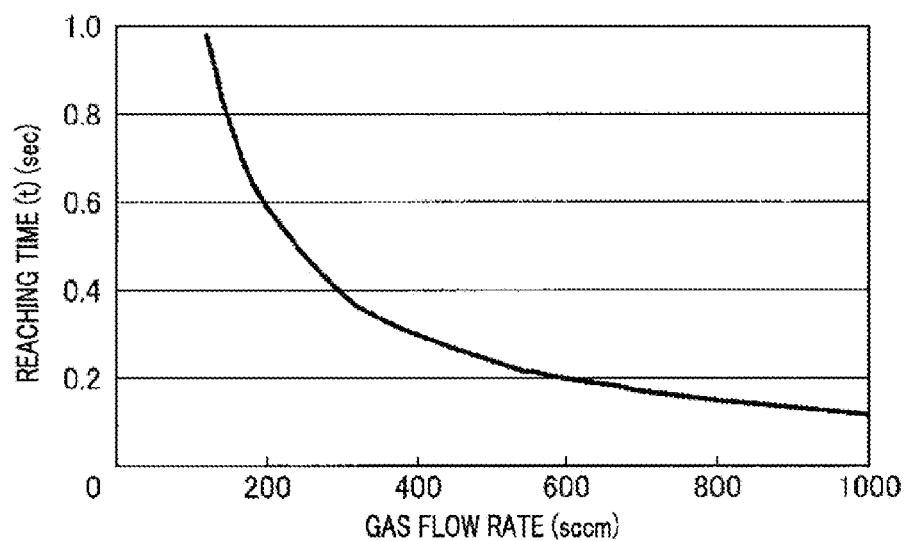
FIG. 11 is a graph showing a relationship between a gas flow rate in a small-volume region formed between a mounting table and the head unit and a time for reaching a certain pressure.

Now, a pressure control will be explained. FIG. 10 is a graph showing a relationship between a gas flow rate in the whole processing chamber and a time for reaching a certain pressure. FIG. 11 is a graph showing a gas flow rate in the small-volume region formed between the mounting table 34 and the head unit 62 and a time for reaching a certain pressure. In FIGS. 10 and 11, a vertical axis denotes a time (sec) for reaching and a horizontal axis denotes a gas flow rate (sccm). The gas flow rate is a conversion flow rate in terms of an Ar (argon) gas. The graphs of FIGS. 10 and 11 show a case where a pressure is increased from about 1 Torr to about 3 Torr. FIG. 10 shows a case where a total volume of the processing chamber is about 54 liters. FIG. 11 shows a case where a volume of the small-volume region formed between the mounting table 34 and the head unit 62 is about 0.75 liters.

Referring to FIGS. 10 and 11, it can be seen that at any gas flow rate, a time for reaching about 3 Torr is much shorter in the case shown in FIG. 11. Desirably, the volume of the small-volume region formed between the mounting table and the head unit 62 is less than, for example, about 50% of the total volume of the processing chamber 32. More desirably, the volume of the small-volume region is less than, for example, about 20% of the total volume of the processing chamber 32. In the cases shown in FIGS. 10 and 11, the volume of the small-volume region is about 1.4% of the total volume of the processing chamber 32.

Thereafter, the film forming gas is supplied on the target substrate W from the gas supply holes 68. To be specific, the film forming gas containing a precursor gas is injected from the gas supply holes 68. Thus, a single layer of gas is adsorbed on the target substrate W. In this case, a molecular layer containing silicon atoms is formed as the single layer.

After the film forming gas is adsorbed on the target substrate W, the head unit 62 is moved to the second position and is retreated to the receiving unit 71. After the head unit 62 is retreated to the receiving unit 71, the shielding plate 72 is moved upwards. As a result, the inner region of the receiving unit 71 is shielded from the outer region of the receiving unit 71 by the shielding plate 72.

Subsequently, the process proceeds to step (B) of Table 1, and an exhaustion and purge process for removing the film forming gas containing a non-adsorbed precursor gas from the processing chamber 32 is performed as a physical adsorption removing process (step (B) of FIG. 9). The exhaustion of the processing chamber 32 is carried out by using the exhaust hole 43 and the exhaust device.

After the exhaustion, the process proceeds to step (C) of Table 1, and the plasma process is performed with microwave (step (C) of FIG. 9). To be specific, a plasma processing gas containing a gas for plasma excitation and a reactant gas is supplied from the plasma processing gas supply unit 33 into the processing chamber 32. Herein, the reactant gas is an oxygen ($O_2$) gas. Then, plasma is generated within the plasma processing chamber 32 by the plasma generating device 39. A plasma process is performed on the previously formed adsorption layer containing silicon atoms by using the microwave. The plasma process with the microwave includes a termination process of the adsorption layer containing silicon molecules and an oxidation process of the silicon atoms. This plasma process is performed in the plasma diffusion region.

A series of steps (A) to (C) is repeated in this sequence until a required film thickness can be obtained. The film thickness is actually selected from a range of, for example, from about 1 nm to about 500 nm. In this way, a silicon oxide film is formed on the target substrate W. Thereafter, an etching process is repeatedly performed on certain regions of the target substrate W to manufacture the semiconductor device as depicted in FIG. 1. Such a process is referred to as a PE-ALD process using a RLSA. Further, such an apparatus is referred to as a PE-ALD apparatus using a RLSA.

In this plasma processing apparatus, when the gas is adsorbed on the target substrate, the adsorption layer can be formed in the small-volume region formed between the mounting table and the head unit. Thus, it is possible to reduce a supply amount of the film forming gas during the adsorption process or it is possible to reduce a time for controlling the pressure between the adsorption process and the plasma process. Therefore, it is possible to form the film efficiently. Furthermore, an inner wall surface of the processing chamber is not exposed to the film forming gas. As a result, it is possible to prevent a film from being formed on the inner wall surface. Moreover it is possible to prevent a reaction product from adhering to the inner wall surface of the processing chamber. Thus, it is possible to reduce the number of processes for cleaning the inner wall surface of the processing chamber. Further, it is possible to prevent particles from being generated. In this plasma processing apparatus, it is possible to form a high-quality film efficiently.

Further, in the gas supply device for this plasma processing apparatus, it is possible to form a high-quality film efficiently.

In this case, the head unit is accommodated in the receiving unit and shielded by the shielding plate. Thus, during the plasma process, it is possible to prevent a reaction product from adhering to inner wall surfaces of the head unit and the receiving unit during the plasma process.

Although the receiving unit is extended straightly toward the outside from the part of the sidewall in the above-described illustrative embodiment, the present illustrative embodiment is not limited thereto. The receiving unit may be extended diagonally toward the outside from the part of the sidewall. A volume of the receiving unit may be substantially the same as a size of the head unit, and a sidewall of the head unit may include a shielding member. The shielding plate is moved in, but not limited to, a vertical direction and may be moved in a horizontal direction, along a circumference, or in a diagonal direction. The shielding plate may be formed in a shutter for dividing the inner region of the receiving unit from the inner region of the processing chamber. The shielding member may not be provided depending on its application.

Figure 12:
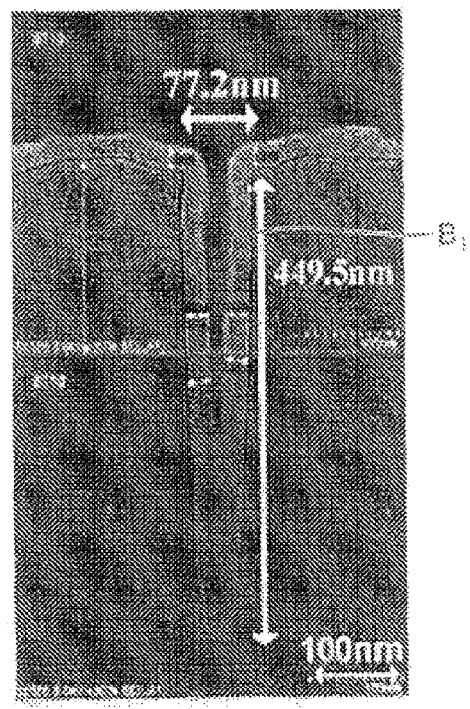
FIG. 12 is a micrograph providing an enlarged cross sectional view of a liner film formed by a PE-ALD method using a RLSA when an aspect ratio is about 6.
Figure 13:
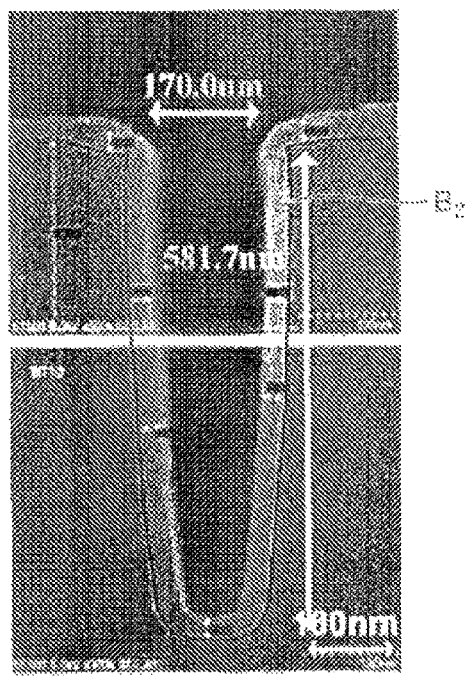
FIG. 13 is a micrograph providing an enlarged cross sectional view of a liner film formed by a PE-ALD method using a RLSA when an aspect ratio is about 3.

FIG. 12 is a micrograph providing an enlarged cross sectional view of a liner film formed by a PE-ALD method using a RLSA and illustrates a case where an aspect ratio is about 6. FIG. 13 is a micrograph providing an enlarged cross sectional view of a liner film formed by a PE-ALD method using a RLSA and illustrates a case where an aspect ratio is about 3. The liner film is indicated by an arrow $B_1$ of FIG. 12 and also indicated by an arrow $B_2$ of FIG. 13. When the liner film is formed, a gas containing BTBAS (bis-tertiary-butyl-aminosilane) is used as a precursor gas. This liner film is formed on a surface of a trench in device isolation regions before the trench is filled with an insulation film. Further, the liner film requires a high insulation property.

In FIG. 12, a width of a trench is about 77.2 nm and a depth of the trench is about 449.5 nm, and, thus, an aspect ratio is about 5.8. In FIG. 13, a width of a trench is about 170.0 nm and a depth of the trench is about 581.7 nm, and, thus, an aspect ratio is about 3.4.

Referring to FIGS. 12 and 13, it can be seen that regardless of whether the aspect ratio is about 6 or about 3, the trench is completely covered and the liner film is formed even at the innermost area of the trench.

As described above, in accordance with this film forming method, even if the target substrate includes a shape having a high aspect ratio or a minute step-shaped portion of, for example, about 50 nm, it is possible to form a film so as to completely cover the shape. Since the plasma process is performed with the microwave plasma, it is possible to greatly reduce plasma damage during the film formation. Therefore, in accordance with this film forming method, it is possible to efficiently form a high-quality film.

Further, in accordance with this film forming method, it is possible to form a silicon oxide film having a high insulation property in the semiconductor device at a low temperature. Thus, it is possible to avoid a problem caused by a limitation on a sequence of the manufacturing process.

Further, the insulating film formed as described above has a high insulation property.

Furthermore, the semiconductor device including the insulating film formed as described above has a high quality since the insulating film has a high insulation property.

The head unit in the above-described illustrative embodiment is moved in, but not limited to, a transverse direction, i.e., a horizontal direction, within the processing chamber, and may be moved in a vertical direction within the processing chamber.

A temperature control unit capable of controlling temperatures of the head unit and the supporting member may be provided. With this configuration, a temperature of a gas to be supplied is controlled appropriately and a film can be formed more efficiently. To be specific, by way of example, a heater and a sensor (both not shown) are provided within the head unit and within the supporting member, respectively. The heater is ON/OFF by the control unit of the plasma processing apparatus based on temperature information sent from the sensor. The heater or the sensor may be provided at the outside of the head unit or the supporting member. The temperature control unit may be provided either one of the head unit and the supporting member.

A desired temperature during the temperature control is determined depending on a precursor gas to be used. By way of example, a temperature may be set in a range corresponding to a vapor pressure of a precursor gas to be used. To be specific, the temperature may be set in a range in which the vapor pressure of the precursor gas is about 10 Torr (about $1.333 \times 10^3$ Pa) or more or in a range in which the vapor pressure of the precursor gas is about 100 Torr (about $1.333 \times 10^4$ Pa) or more.

Figure 14:
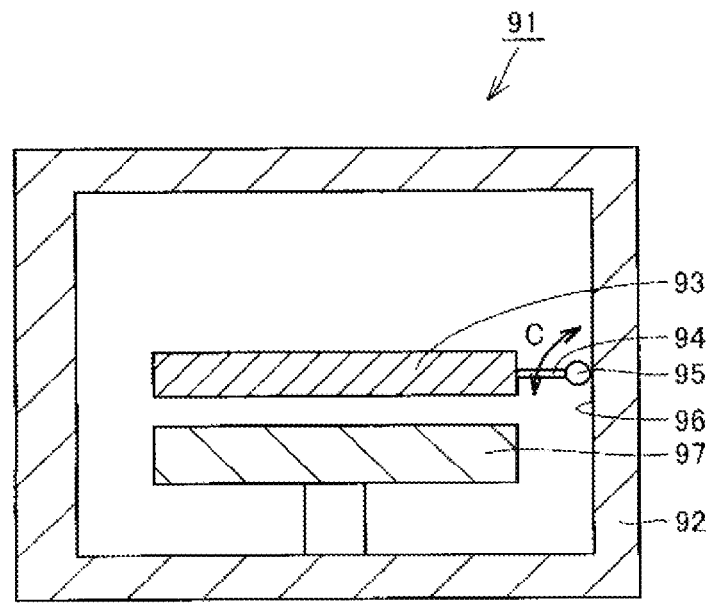
FIG. 14 is a schematic cross sectional view illustrating a part of a plasma processing apparatus in which a head unit is configured to be movable by being rotated in a vertical direction.

FIG. 14 is a schematic cross sectional view illustrating a part of a plasma processing apparatus in this case. Referring to FIG. 14, a processing chamber 92 of a plasma processing apparatus 91 includes a head unit 93 and a supporting member 94. An outer peripheral end portion 95 of the supporting member 94 is provided at an inner wall surface 96 of the processing chamber 92. The head unit 93 and the supporting member 94 are configured to be rotated around the outer peripheral end portion 95 in a direction indicated by an arrow C of FIG. 14, i.e., in a vertical direction. The head unit 93 may be provided at a first position above a mounting table 97. Further, the head unit 93 may be provided at a second position by being rotated upwardly from the position depicted in FIG. 14.

In a film forming process, the head unit 93 is positioned above the mounting table 97 while a gas is adsorbed. Then, during a plasma process, the head unit 93 is rotated together with the supporting member 94 in the direction indicated by the arrow C of FIG. 14. As a result, the head unit 93 is positioned at the second position, i.e., a position inclined toward the inner wall surface 96. Thereafter, a plasma process is performed on the target substrate with microwave. The above-described configuration may be adopted.

Figure 15:
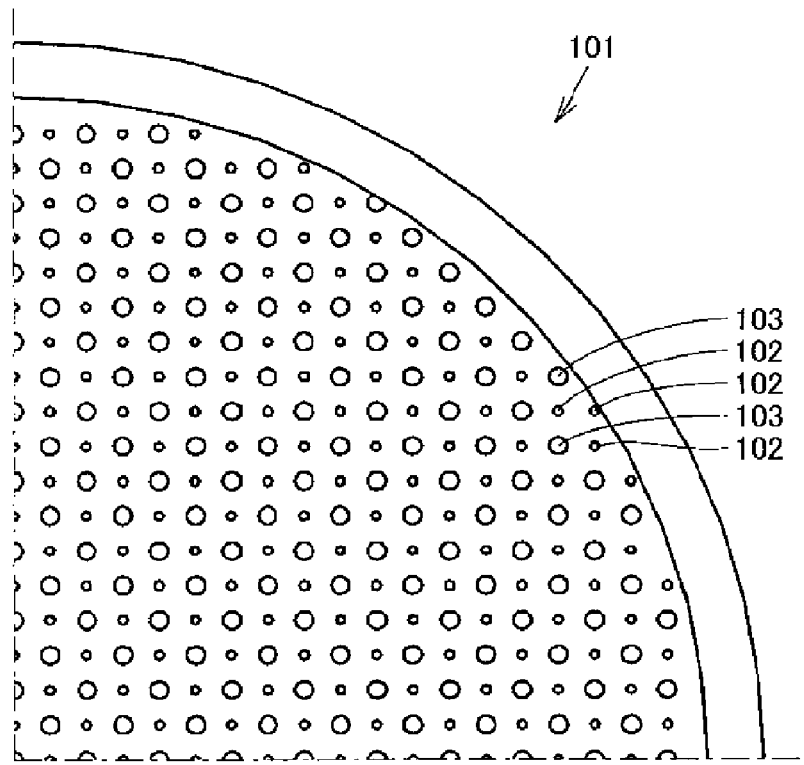
FIG. 15 illustrates a part of a head unit including gas exhaust holes when viewed in a plate-thickness direction and corresponds to FIG. 6.

In the illustrative embodiment, the head unit may include an exhaust device. FIG. 15 illustrates a part of a head unit 101 provided in a plasma processing apparatus in this case when viewed in a plate-thickness direction and corresponds to FIG.

Figure 16:
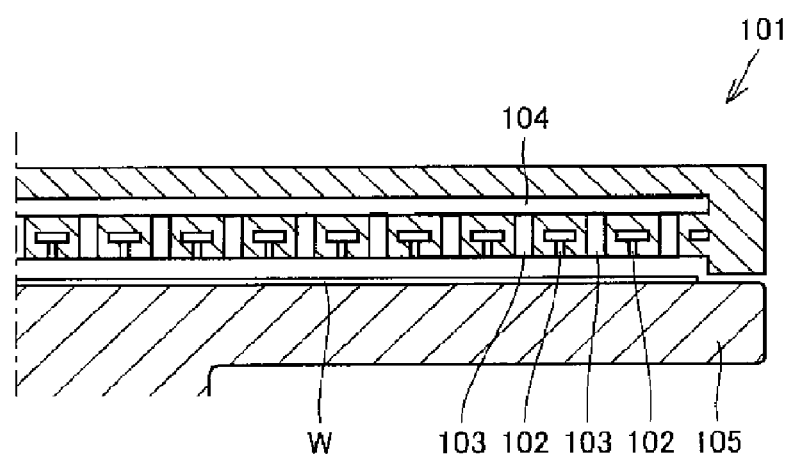
FIG. 16 is a cross sectional view illustrating a part of a head unit including gas exhaust holes and corresponds to FIG. 7.

6. FIG. 16 is a cross sectional view illustrating a part of the head unit 101 depicted in FIG. 15 and corresponds to FIG. 7. The overall configuration of the plasma processing apparatus including the head unit of FIGS. 15 and 16 is shown in FIGS. 2 and 8.

Referring to FIGS. 15 and 16, the head unit 101 includes a plurality of gas supply holes 102 in the same manner as the head unit depicted in FIG. 6 and gas exhaust holes 103 for exhausting. The gas exhaust holes 103 are plural in number. The gas exhaust holes 103 are arranged away from the gas supply holes 102 with substantially the same distance therebetween in longitudinal and transverse directions depicted in FIG. 15. A gas exhaust path 104 serving as a path of a film forming gas to be exhausted is provided in the head unit 101 and a non-illustrated supporting member. With this configuration, while the head unit 101 is positioned above a mounting table 105, a non-adsorbed film forming gas can be exhausted. Thus, it is not necessary to exhaust a gas in the whole processing chamber, and, thus, throughput can be increased.

Figure 17:
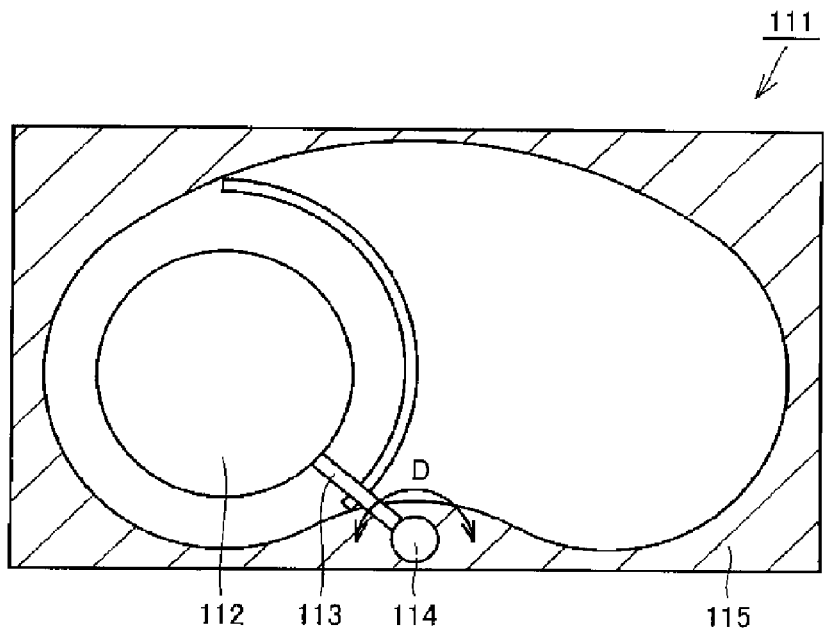
FIG. 17 is a schematic cross sectional view illustrating major components of a plasma processing apparatus in which a head unit is configured to be rotatable in a horizontal direction.
Figure 18:
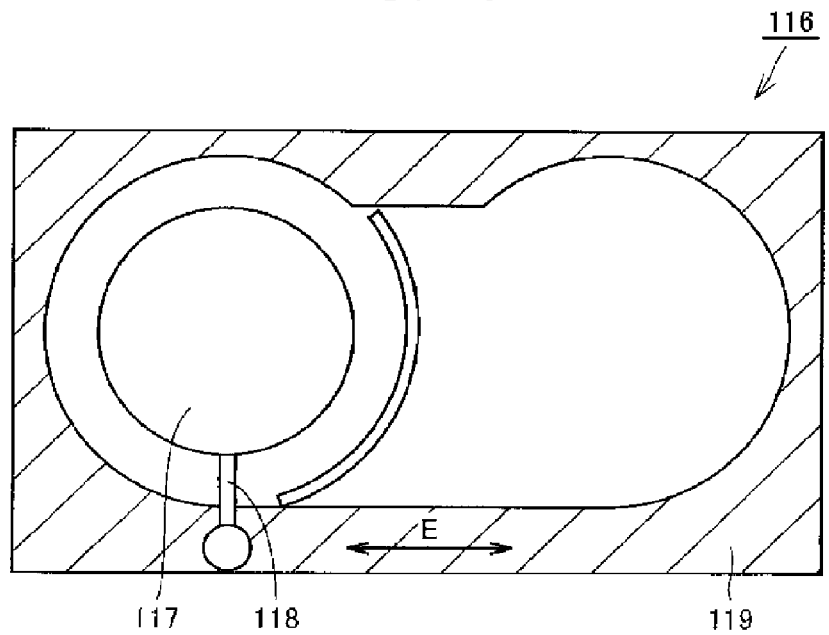
FIG. 18 is a schematic cross sectional view illustrating major components of a plasma processing apparatus in which a head unit is configured to be movable in a horizontal direction.

As depicted in FIG. 17, a head unit 112 provided in a plasma processing apparatus 111 may be configured to be rotated around a base portion 114 of a supporting member 113 in a horizontal direction indicated by an arrow D within a processing chamber 115. Otherwise, as depicted in FIG. 18, a head unit 117 provided in a plasma processing apparatus 116 may be configured to be moved together with a supporting member 118 in a horizontal direction indicated by an arrow E within a processing chamber 119.

Figure 25:
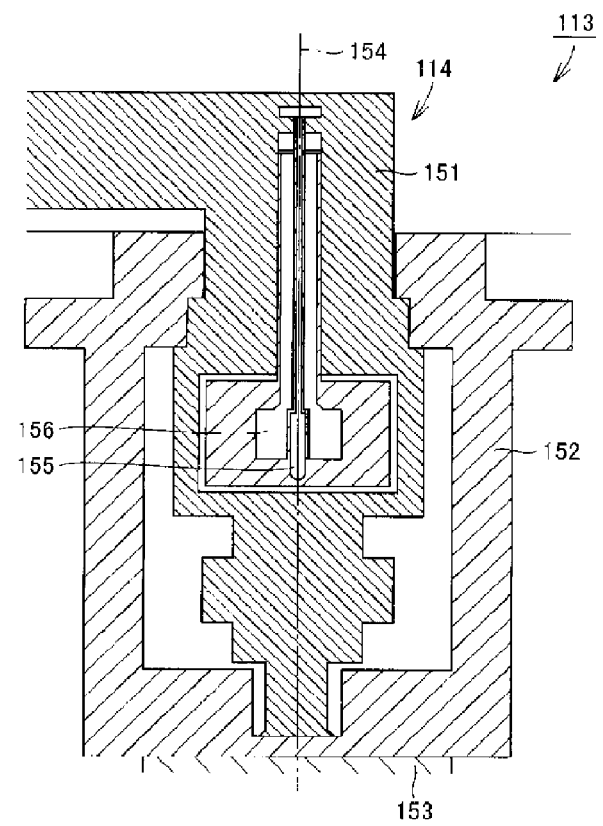
FIG. 25 is a schematic cross sectional view illustrating a part of a vicinity of a base portion of a supporting member illustrated in FIG. 17.
Figure 26:
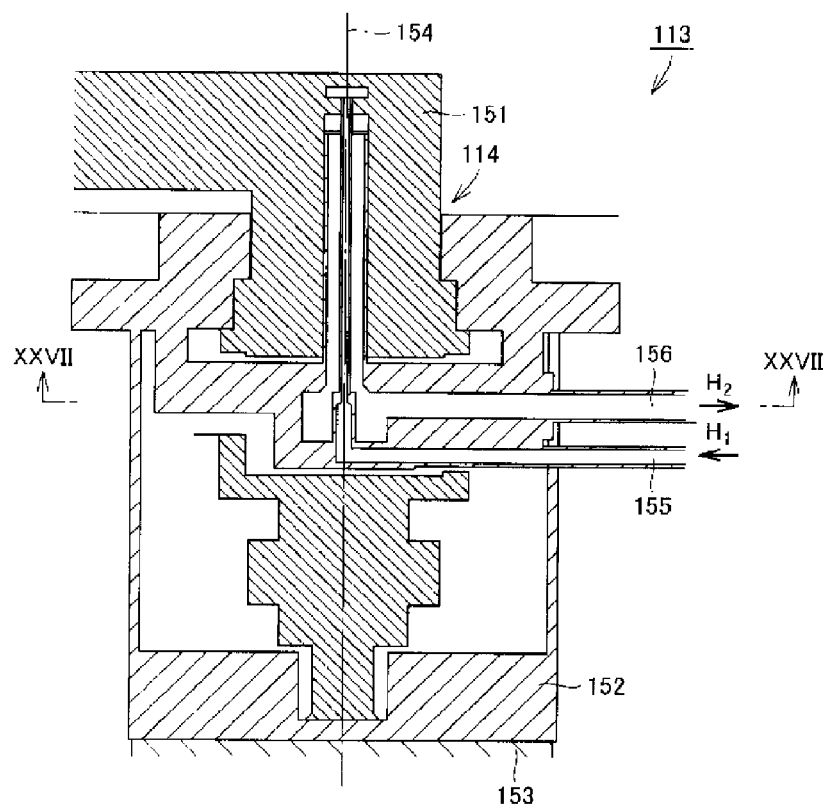
FIG. 26 is a schematic cross sectional view illustrating a part of a vicinity of the base portion of the supporting member illustrated in FIG. 17 and corresponds to a cross sectional view when the cross sectional view illustrated in FIG. 25 is rotated by 90 degrees.
Figure 27:
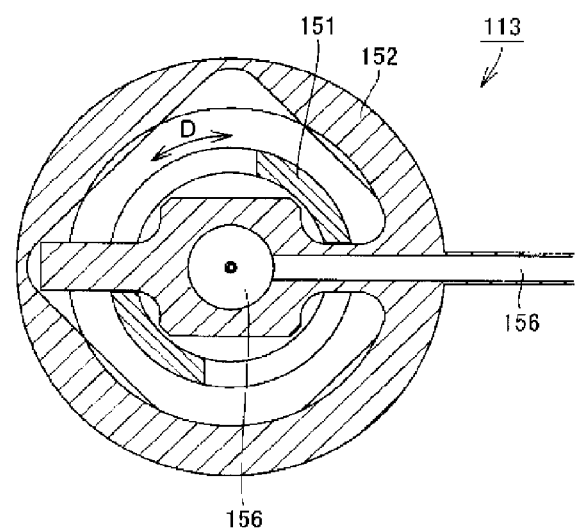
FIG. 27 is a schematic cross sectional view illustrating a part of a vicinity of the base portion of the supporting member illustrated in FIG. 17 and corresponds to a cross sectional view taken along a line XXVII-XXVII of FIG. 26.

Herein, the supporting member 113 may have a configuration as follows. FIGS. 25, 26 and 27 are schematic cross sectional views illustrating a part of a vicinity of the base portion 114 of the supporting member 113 illustrated in FIG. 17. The cross sectional view of FIG. 25 corresponds to a cross sectional view obtained when the vicinity of the base portion 114 of the supporting member 113 is cut by a plane extended in a front-and-back direction of the paper surface of FIG. 17. The cross sectional view of FIG. 26 corresponds to a cross sectional view rotated about 90 degrees from the cross sectional view of FIG. 25. The cross sectional view of FIG. 27 corresponds to a cross sectional view taken along a line XXVII-XXVII in FIG. 26.

Referring to FIG. 17 and FIGS. 25 to 27, a movable part 151 is rotatably provided at the base portion 114 of the supporting member 113, and a fixed part 152 is fixed to a base 153. A lower portion of the fixed part 152 is fixed to the base 153. The movable part 151 can be rotated about 90 degrees in a direction indicated by the arrow D of FIGS. 17 and 27 around a rotation central axis 154 extended in a vertical direction of the paper surfaces of FIGS. 25 and 26 as indicated by a dashed dotted line.

Within the supporting member 113 and the base portion 114, a gas supply path 155 communicating with a gas supply hole (not shown) for supplying a gas toward a head unit, and a gas exhaust path 156 serving as a path of an exhausted film forming gas and communicating with a gas exhaust hole (not shown) are provided. Herein, the gas supply path 155 and the gas exhaust path 156 are formed in a double-structure in which the gas supply path 155 is positioned inside and the gas exhaust path 156 is positioned outside. That is, a gas is supplied in a direction indicated by an arrow $H_1$ of FIG. 26 and exhausted in a direction indicated by an arrow $H_2$ of FIG. 26.

With this configuration, since the gas exhaust path 156 is positioned outside, even if a gas supplied from the gas supply path 155 is leaked from a part of the gas supply path 155, the gas leaked to the gas exhaust path 156 returns back to be exhausted. Thus, it is possible to prevent the gas leaked from the gas supply path 155 from being introduced into other areas. Therefore, it is possible to more stably and accurately supply a gas from the gas supply path 155 to the head unit.

In this case, the gas supply path 155 may be formed in a double or a multiple structure, and the gas exhaust path 156 may be formed in a double or a multiple structure. That is, a gas supply device may include the supporting member that is extended from the sidewall and supports the head unit at a connection region between an inner portion of the supporting member and the head unit. A gas exhaust device may include the gas exhaust path serving as a path through which a gas exhausted toward an inside of the supporting member passes. The gas supply device includes the gas supply path serving as a path through which a gas to be supplied into the supporting member passes. Desirably, the gas supply path and the gas exhaust path are formed in a multiple structure in which the gas supply path is arranged inside the gas exhaust path.

A plasma processing apparatus may include two or more processing chambers, and a single head unit may move back and forth between the two or more processing chambers.

Figure 19:
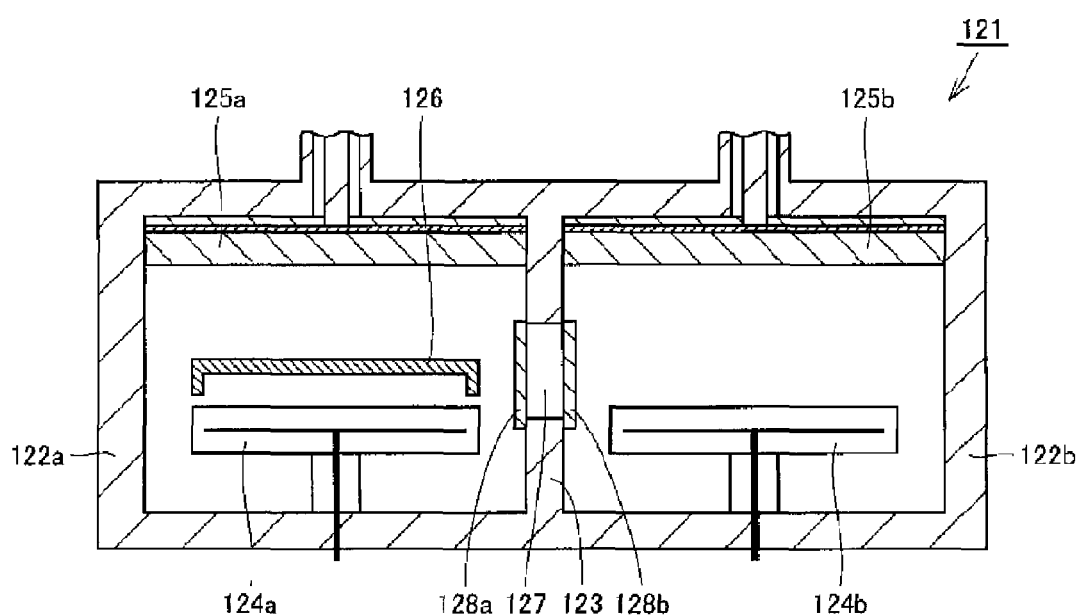
FIG. 19 is a schematic cross sectional view illustrating major components of a plasma processing apparatus including a head unit configured to move back and forth between first and second processing chambers.

FIG. 19 is a schematic cross sectional view illustrating a part of a plasma processing apparatus in this case. Referring to FIG. 19, a plasma processing apparatus 121 includes a first processing chamber 122a positioned at the left of FIG. 19 and a second processing chamber 122b positioned t the right of FIG. 19. The first processing chamber 122a and the second processing chamber 122b are configured to share a sidewall 123 provided therebetween. The processing chambers 122a and 122b include mounting tables 124a and 124b, a plasma processing gas supply unit, and dielectric windows 125a and 125b, respectively. In each of the processing chambers 122a and 122b, a plasma process can be performed on each target substrate W. However, only a single gas supply device including a head unit 126 is provided in the plasma processing apparatus.

Herein, a part of the sidewall 123 between the first processing chamber 122a and the second processing chamber 122b is opened. The head unit 126 can be movable between the first processing chamber 122a and the second processing chamber 122b through an opening 127. The first processing chamber 122a and the second processing chamber 122b include a first shutter 128a and a second shutter 128b, respectively. The first shutter 128a and the second shutter 128b are capable of opening and closing the opening 127. To be specific, the head unit 126 can move back and forth between the first processing chamber 122a and the second processing chamber 122b through the opening 127.

With this configuration, it is possible to perform a film forming process efficiently. That is, by way of example, while a plasma process is performed on the target substrate W in the second processing chamber 122b, the head unit 126 is moved to the first processing chamber 122a. Then, a gas adsorption process can be performed on the target substrate W by the head unit 126 in the first processing chamber 122a. Therefore, it is possible to form a film with efficiently. In this case, the two processing chambers may share a plasma generator or the like.

Figure 28:
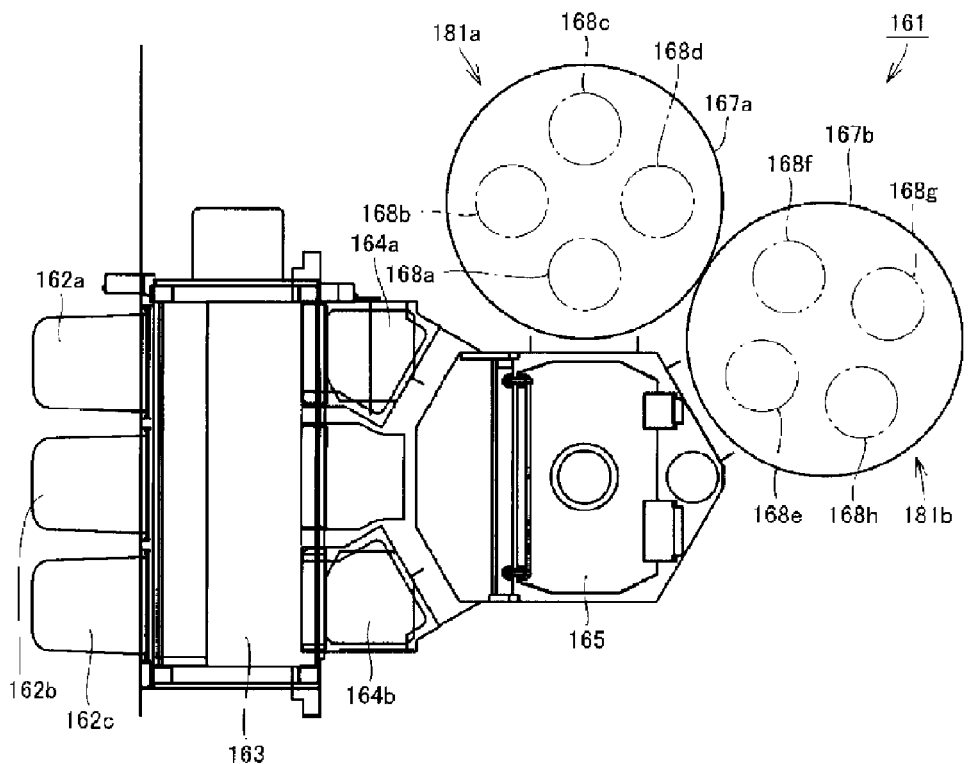
FIG. 28 is a schematic cross sectional view illustrating a configuration of a plasma processing system.

The plasma processing apparatus may include a target substrate moving unit capable of, at least one of, supporting a target substrate on a mounting table and separating the target substrate supported on the mounting table. FIG. 28 is a schematic cross sectional view illustrating a configuration of a plasma processing system in this case. Referring to FIG. 28, a plasma processing system 161 includes three load ports 162a, 162b, and 162c; a load module 163; two load-lock modules 164a and 164b; a transfer module 165; two plasma processing apparatuses 181a and 181b; and a target substrate transfer unit (not shown). The load ports 162a, 162b, and 162c serve as a loading port for a unprocessed target substrate W or a unloading port for a processed target substrate W and are configured to transfer a target substrate W between the plasma processing system 161 and the outside. The load module 163 includes a space where the target substrate W is transferred under an atmospheric atmosphere. The load-lock modules 164a and 164b are provided between the load module 163 and a transfer module 165 and configured to control a pressure. The transfer module 165 includes a space where the target substrate W is transferred under a vacuum atmosphere. Each of the plasma processing apparatuses 181a and 181b is configured to perform a plasma process on the target substrate W. The target substrate transfer unit (not shown) is provided within the transfer module 165, and configured to transfer the target substrate W between plasma processing apparatuses 181a and 181b by using a non-illustrated arm.

Each of mounting tables 167a and 167b provided in each of the plasma processing apparatuses 181a and 181b can mount and hold thereon four target substrates W. The mounting table 167a has supporting areas 168a, 168b, 168c, and 168d for the four target substrates W as indicated by a dashed dotted line of FIG. 28. Further, the mounting table 167b has supporting areas 168e, 168f, 168g, and 168h for the four target substrates W as indicated by a dashed dotted line of FIG. 28. Herein, although the mounting tables 167a and 167b are configured to mount the four target substrates W thereon, the number of the target substrate W is not limited, and, thus, for example, two or more target substrates W can be mounted thereon.

Figure 29:
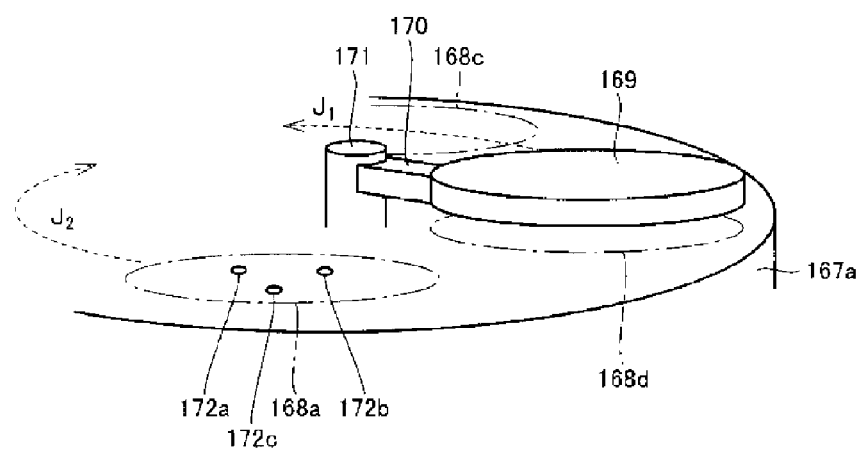
FIG. 29 is a schematic perspective view illustrating a vicinity of a rotatable mounting table.

FIG. 29 is a schematic cross sectional view illustrating a vicinity of the mounting table 167a. Referring to FIG. 29, three pins (not shown) are used to support the target substrates W on the mounting table 167a and separate the target substrates W from the mounting table 167a. The support and separation of the target substrates W by the pins will be explained later. Further, FIG. 29 illustrates three pin holes 172a, 172b, and 172c, where three pins are provided, in the area 168a of the mounting table 167a. Illustration of other pin holes in the other areas 168b to 168d will be omitted. The three pin holes 172a to 172c are positioned so as to form a substantially equilateral triangle when the pin holes are connected by a virtual line. That is, each of the three pin holes 172a to 172c is positioned at each angle of a virtual equilateral triangle.

The plasma processing apparatus 181a including the mounting table 167a includes a head unit 169. The head unit 169 is provided at a supporting member 170. The head unit 169 can be rotated about 360 degrees in a direction indicated by an arrow $J_1$ of FIG. 29 around a base portion 171 at an outer end portion of the supporting member 170. Thus, it is possible to efficiently perform a film forming process on the target substrate W mounted on each of the four areas 168a to 168d. The mounting table 167a can be rotated about 360 degrees in a direction indicated by an arrow $J_2$ of FIG. 29 around a center of the base portion 171.

With this configuration, the target substrate W to be processed can be loaded, i.e., supported on the mounting table 167a, or the processed target substrate W can be unloaded, i.e., separated from the mounting table 167a, efficiently. Herein, the rotatable mounting table 167a and the pins serve as the target substrate moving unit capable of, at least one of, supporting a target substrate on a mounting table and separating the target substrate supported on the mounting table. That is, the plasma processing apparatus includes the mounting table and the pins serving as the target substrate moving unit capable of, at least one of, supporting a target substrate on the mounting table and separating the target substrate supported on the mounting table.

The plasma processing apparatus 181b including the mounting table 167b includes a head unit 173, a supporting member 174b, and a base portion 175. A mounting unit 176 configured to mount a target substrate W thereon is provided opposite the head unit 173 with the base portion 175 therebetween. The mounting unit 176 is supported by the supporting member 174b. The supporting member 174a configured to support the head unit 173 and the supporting member 174b configured to support the mounting unit 176 are arranged so as to have a position opposite to with the base portion 175 therebetween. A line connecting the supporting member 174a and the supporting member 174b is a substantially straight line.

Figure 30:
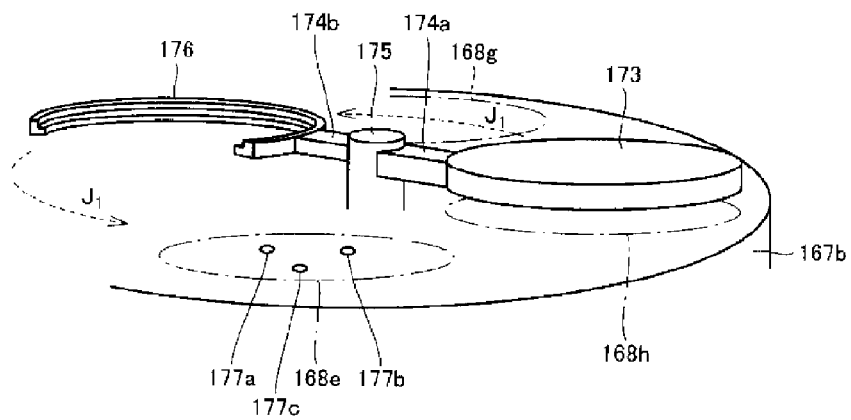
FIG. 30 is a schematic perspective view illustrating a vicinity of a fixed mounting table.

The mounting unit 176 has an L-shaped cross section and is formed in a substantially semicircular shape when viewed from a rotation axis direction. The mounting unit 176 can mount the target substrate W on an upper surface of the L-shaped cross section. Due to rotation of the base portion 175, the head unit 173 and the mounting unit 176 can be rotated about 360 degrees around the center of the base portion 175. Thus, even if the mounting table 167b is fixed and cannot be rotated, the target substrates W supported on the four supporting areas 168e to 168h can be loaded and unloaded. FIG. 30 illustrates three pin holes 177a, 177b, and 177c, where three pins are provided, in the area 168e of the mounting table 167b. Illustration of other pin holes in the other areas 168f to 168h will be omitted.

Figure 31:
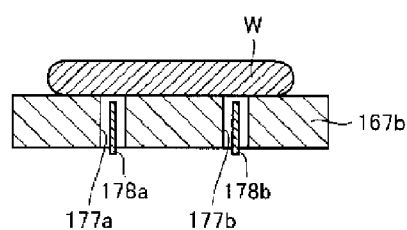
FIG. 31 is a schematic cross sectional view illustrating a part of a mounting table when a target substrate W is supported and separated by pins, and illustrates a status where the target substrate W is supported on the mounting table.

The support and separation of the target substrates W by the pins will be explained as follows. FIGS. 31, 32, 33, and 34 are schematic cross sectional views illustrating a part of the mounting table 167b when a target substrate W is supported and separated by pins. Referring to FIG. 31, a target substrate W is supported on the area 168e of the mounting table 167b. The area 168e supporting the target substrate W includes pins 178a and 178b and pin holes 177a and 177b. The pins 178a and 178b are provided within the pin holes 177a and 177b, respectively. In FIGS. 31 to 34, for easy understanding, illustration of a pin hole 177c and a pin provided within the pin hole 177c will be omitted. The pins 178a and 178b can be moved in a vertical direction of the paper surface of FIG. 31.

Figure 32:
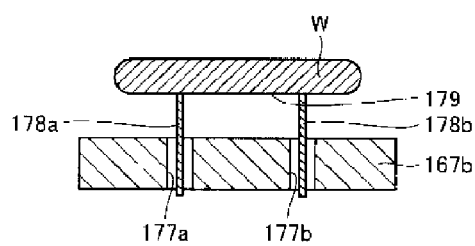
FIG. 32 is a schematic cross sectional view illustrating a part of a mounting table when a target substrate W is supported and separated by pins, and illustrates a status where the target substrate W is supported at upper ends of the pins.

Referring to FIG. 32, the pins 178a and 178b provided within the pin holes 177a and 177b, respectively, can be moved in a vertical direction of the paper surface. Thus, a bottom surface 179 of the target substrate W is pushed by upper end portions of the pins 178a and 178b, so that the target substrate W can be moved upwards. In this case, the target substrate W is mounted on the upper end portions of the pins 178a and 178b. Since there are three pins, the target substrate W can be relatively stably mounted thereon by a so-called "three-point support".

Figure 33:
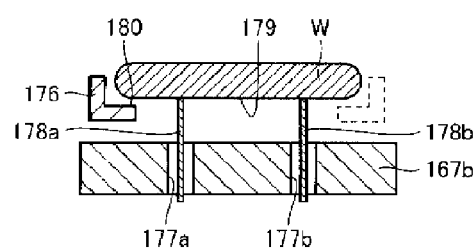
FIG. 33 is a schematic cross sectional view illustrating a part of a mounting table when a target substrate W is supported and separated by pins, and illustrates a status where an upper surface of a mounting unit is positioned to face a bottom surface of the target substrate W.
Figure 34:
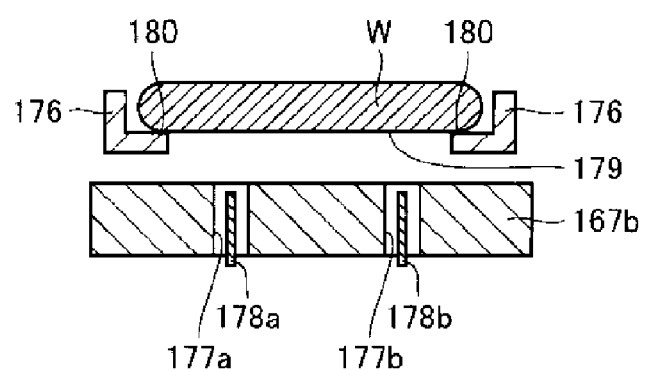
FIG. 34 is a schematic cross sectional view illustrating a part of a mounting table when a target substrate W is supported and separated by pins, and illustrates a status where a target substrate W is mounted on a mounting unit.

Referring to FIG. 33, the mounting unit 176 is rotated and moved to the supporting area 168e. Thus, the bottom surface 179 of the target substrate W is positioned so as to face an upper surface 180 of the L-shaped cross section of the mounting unit 176. In FIG. 33, since an outer area of the mounting unit 176 reaches the above-described position more quickly by rotation, the outer area is indicated by a solid line and an inner area is indicated by a dotted line.

Then, as depicted in FIG. 33, the pins 178a and 178b are moved downwards. Thus, the bottom surface 179 of the target substrate W is mounted on the upper surface 180 of the mounting unit 176. Thereafter, the target substrate W is moved to the outside of the supporting area 168e by rotation of the mounting unit 176.

The target substrate W can be supported on the mounting table 167b in the following manner. After the target substrate W is moved to, a certain position, for example, the area 168f by the mounting unit 176 as described above, while the target substrate W is moved up by raising the pins, the mounting unit 176 is rotated and moved to the outside of the area 168f. Then, the pins are lowered and the target substrate W can be supported on the area 168f.

In this way, even if the mounting table 167b is fixed without rotation, the target substrate W can be supported on the mounting table 167b and separated from the mounting table 167b efficiently.

Herein, the mounting unit and the pins serve as a target substrate moving unit capable of, at least one of, supporting the target substrate on the mounting table and separating the target substrate supported on the mounting table. That is, the plasma processing apparatus includes the mounting unit and the pins serving as a target substrate moving unit capable of, at least one of, supporting the target substrate on the mounting table and separating the target substrate supported on the mounting table.

In the illustrative embodiment, three pins and pin holes are provided in each area, but the number of pins is not limited, and, thus, four or more pins may be provided. If the target substrate W can be mounted stably on the upper end portions of the pins, it is not necessary to position the three pins so as to form an equilateral triangle. Further, a front end portion of the pin may be formed in, for example, a flat plate shape and in this case, even if there is one or two pins, the target substrate W can be temporarily mounted on the pins in a stable manner.

In the illustrative embodiment, the head unit provided in the gas supply device includes the circular plate, but a component is not limited thereto. Thus, the head unit may include a rod-shaped member extended in a horizontal direction within the processing chamber, and the rod-shaped member can be moved in a horizontal direction above the target substrate supported on the mounting table.

Figure 20:
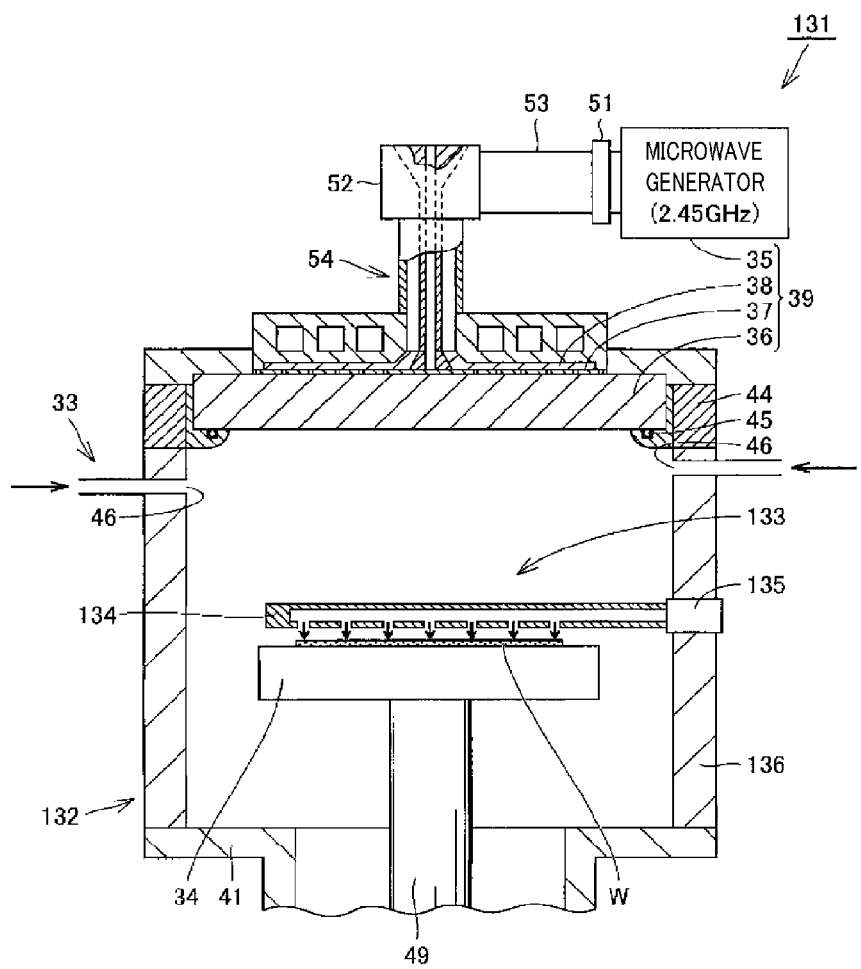
FIG. 20 is a schematic cross sectional view illustrating major components of a plasma processing apparatus in which a head unit includes a rod-shaped member.
Figure 21:
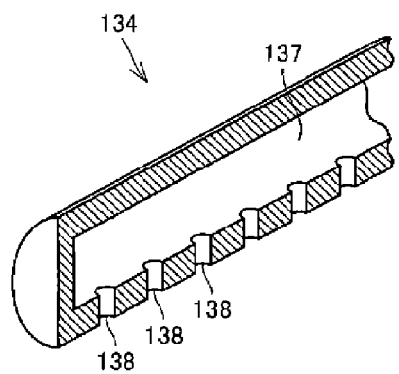
FIG. 21 is a perspective view illustrating a part of the rod-shaped member.

FIG. 20 is a schematic cross sectional view illustrating major components of a plasma processing apparatus in this case and corresponds to the FIG. 2. FIG. 21 is a perspective view illustrating a part of a rod-shaped member provided in the plasma processing apparatus. The plasma processing apparatus 131 depicted in FIG. 20 may include the same components as the plasma processing apparatus 31 depicted in FIG. 2. Those components will be assigned the same reference numerals, and explanation thereof will be omitted.

Referring to FIGS. 20 and 21, a head unit 133 of a gas supply device provided in the plasma processing apparatus 131 includes a rod-shaped member extended in a horizontal direction within a processing chamber 132. When being cut by a plane orthogonal to a longitudinal direction of the rod-shaped member, the rod-shaped member has a cross section of a substantially circular shape. A base portion 135 as an end portion of the rod-shaped member 134 is provided at a sidewall 136 of the processing chamber 132. That is, the rod-shaped member 134 is configured to be supported by the sidewall 136. A distance between a lowermost portion of the rod-shaped member 134 and the mounting table 34 is, for example, about 10 mm. The rod-shaped member 134 is configured to cover a part of the target substrate W when the rod-shaped member 134 is positioned above the mounting table 34.

The rod-shaped member 134 has a hollow shape. The hollow within the rod-shaped member 134 serves as a gas supply path 137 provided in the head unit and the supporting member included in the gas supply device of the plasma processing apparatus depicted in FIG. 2. Further, the rod-shaped member 134 includes gas supply holes 138 at its lower surface facing the target substrate W so as to be connected to the gas supply path 137. The gas supply holes 138 are in plural in number and arranged away from each other with a certain distance therebetween in a longitudinal direction of the rod-shaped member 134.

Figure 22:
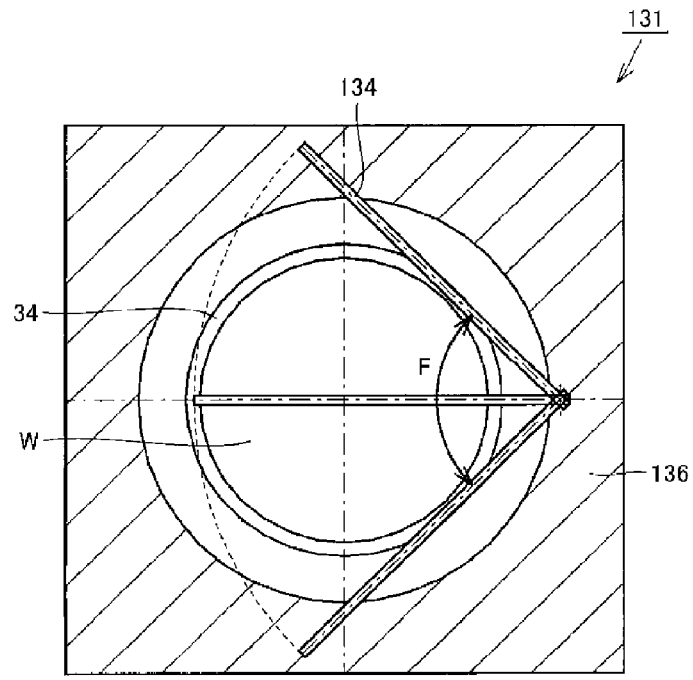
FIG. 22 is a schematic cross sectional view illustrating major components of a plasma processing apparatus in which the rod-shaped member is configured to be rotatable in a horizontal direction.

The rod-shaped member 134 can be moved in a horizontal direction above the target substrate W. FIG. 22 is a schematic cross sectional view illustrating major components of the plasma processing apparatus 131 depicted in FIG. 20, and FIG. 22 is also a top view of the plasma processing apparatus 131. Referring to FIGS. 20 and 22, the rod-shaped member 134 can be moved in a horizontal direction above the target substrate W held on the mounting table 34. In this case, the rod-shaped member 134 can be rotated around the base portion 135 in a direction indicated by an arrow F of FIG. 22. In this case, the rod-shaped member 134 can be positioned at a first position and a second position. The first position is above the target object W, and the second position refers to other places than the first position. The sidewall 136 of the plasma processing apparatus 131 has a rectangular shape. The plasma processing apparatus 131 configured as such can obtain the same effect as described above. The rod-shaped member has a relatively simple configuration, and, thus, it is possible to reduce manufacturing cost of the rod-shaped member 134. Further, a small-volume region in this case is formed between the rod-shaped member 134 and the mounting table 34.

Figure 23:
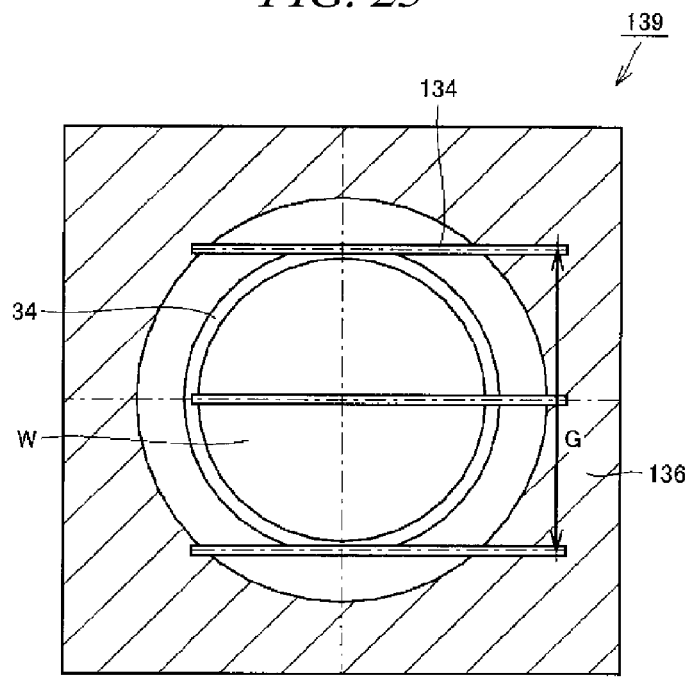
FIG. 23 is a schematic cross sectional view illustrating major components of a plasma processing apparatus in which the rod-shaped member is configured to be movable in a horizontal direction.

As depicted in FIG. 23, the whole rod-shaped member 134 provided in a plasma processing apparatus 139 can be moved in a horizontal direction so as to move toward a direction indicated by an arrow G of FIG. 23.

Figure 24:
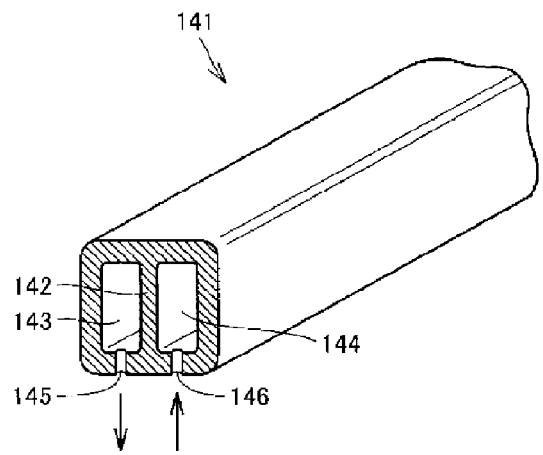
FIG. 24 is a perspective view illustrating a part of a rod-shaped member including gas exhaust holes.

A rod-shaped member may include gas exhaust holes. FIG. 24 is a cross sectional view illustrating a part of a rod-shaped member in this case and corresponds to FIG. 21. Referring to FIG. 24, a hollow within a rod-shaped member 141 is divided by a wall 142. A part of the hollow divided by the wall 142 serves as a gas supply path 143, and the other part of the hollow serves as a gas exhaust path 144. In the same manner as the rod-shaped member 134 depicted in FIG. 21, the rod-shaped member 141 includes multiple gas supply holes 145 configured to supply a film forming gas on a target substrate W and arranged away from each other with a certain distance therebetween in a longitudinal direction of the rod-shaped member 141. As a result, the gas supply holes are connected to the gas supply path 143. Further, a multiple number of gas exhaust holes 146 configured to exhaust a gas to a small-volume region and arranged away from each other with a certain distance therebetween in the longitudinal direction are provided. As a result, the gas exhaust holes are connected to the gas exhaust path 144. The above-described configuration may be adopted. In this case, the rod-shaped member 141 has a cross section of a rectangular shape.

In the illustrative embodiments, the mounting table may be configured to be moved in at least one of a vertical direction and a horizontal direction. With this configuration, it is possible to more appropriately perform a plasma process or a gas adsorption process. To be specific, by way of example, when the head unit is provided at the first position, the mounting table may be moved to approach the head unit in cooperation with a movement of the head unit.

Further, in the illustrative embodiments, there has been explained a case where the oxidation process is performed to the silicon atoms. The present illustrative embodiment is not limited thereto and can be applied to a case where a nitrification process is performed to the silicon atoms. That is, after the gas adsorption process, a gas containing a nitride, such as a $N_2$ gas, is supplied into the processing chamber, and a plasma process is performed to form a silicon nitride film. The present illustrative embodiment is applied to such a case.

Furthermore, in the illustrative embodiments, the gas containing BTBAS is used as a precursor gas for gas adsorption. Other gases containing silicon may be used. For the plasma process, other gases than the oxygen gas can be used.

Moreover, in the illustrative embodiments, the plasma may be maintained as being generated regardless of a movement of the head unit. In this case, throughput can be further increased.

In the illustrative embodiments, there has been explained a case where the liner film is formed on the surface of the trench in the device isolation regions before the trench is filled with the insulation film. However, the present illustrative embodiment is not limited thereto and can be applied to a case, for example, where a gate oxide film or another insulating layer such as an interlayer insulating film or a gate sidewall is formed in a MOS transistor. Further, the present illustrative embodiment can be efficiently applied to a CCD or a LSI. That is, the present illustrative embodiment can be applied to all film forming processes including a gas adsorption process where a film forming gas is supplied to form an adsorption layer and a plasma process.

To be specific, the film may be used as follows. That is, as a gate insulating film, $SiO_2$, $Al_2O_3$, $HfO_2$, $ZrO_2$, $Ta_2O_5$, and $La_2O_3$ may be used. As a trench capacitor of a DRAM (Dynamic Random Access Memory), $SiO_2$, $HfO_2$, $Al_2O_3$, and $Ta_2O_5$ may be used. As a gas oxide film of a 3-D device such as a FinFET (Field Effect Transistor), $SiO_2$, $Al_2O_3$, $HfO_2$, $ZrO_2$, $Ta_2O_5$, and $La_2O_3$ may be used. As a nano-laminate of MEMS (Micro Electro Mechanical Systems), $HfO_2$, $Ta_2O_5$, $TiO_2$, $Ta_2O_5$, and $Al_2O_3$ may be used. As a UV block layer, $ZnO$ and $TiO_2$ may be used. As an alumina insulating film serving as an organic EL (Electro Luminescence) device, $Al_2O_3$ may be used. As an optical device or a solar cell, $AlTiO$, $SnO_2$, and $ZnO$ may be used. As a piezo-electric element, $ZnO$ may be used.

In the illustrative embodiments, a gas exhaust process for exhausting the inside of the processing chamber may be performed between the gas adsorption process and the plasma process. Otherwise, the gas exhaust process may be performed after the plasma process.

Further, in the illustrative embodiments, the plasma processing gas is supplied from the gas supply holes provided at the sidewall, but the present illustrative embodiment is not limited thereto. The gas supply holes for discharging a gas toward a central area of the target substrate may be provided in, for example, a central area of the dielectric window and the gas may be supplied from these gas supply holes.

Furthermore, in the illustrative embodiments, a thin-plate shaped focus ring may be provided at an outer periphery of the target substrate held on the mounting table. In this case, in the plasma processing apparatus depicted in FIG. 2, the extension member may be positioned above the annular focus ring, i.e., at a first position. With the focus ring, there are some advantages as follows. At the first position, the head unit is configured to cover the target substrate. As a result, a film can be formed at the focus ring around the target substrate, to be specific, at the outer periphery of the target substrate. In this case, the focus ring is allowed to be replaced, so that it is possible to solve the problem of film formation at the outer periphery of the target substrate. Further, by adjusting a thickness of the focus ring, a distance between the head unit and the mounting table can be controlled.

Moreover, in the illustrative embodiments, the plasma process is performed with the microwave by using the RLSA including the slot antenna plate, but the present illustrative embodiment is not limited thereto. A microwave plasma processing apparatus including a comb-shaped antenna may be used.

In the illustrative embodiments, the plasma processing apparatus using the microwave as a plasma source is used, but the present illustrative embodiment is not limited thereto. The present illustrative embodiment can be applied to a plasma processing apparatus using ICP (Inductively-coupled Plasma) or ECR (Electron Cyclotron Resonance) plasma, parallel plate type plasma as a plasma source. A plasma generating device is not limited.

Further, in the illustrative embodiments, there has been explained a case where the insulating film such as a silicon oxide film is formed, but the present illustrative embodiment is not limited thereto and can be applied to a case where a conductive film is formed.

The present illustrative embodiments have been explained by reference to the drawings, but the present illustrative embodiment is not limited thereto. The illustrative embodiments can be changed and modified in various ways within the same or equivalent scope of the present illustrative embodiments.

INDUSTRIAL APPLICABILITY

A plasma processing apparatus and a gas supply device for the plasma processing apparatus in accordance with the present illustrative embodiment may be effectively used to efficiently manufacture a high-quality film.

EXPLANATION OF CODES

11: MOS-type semiconductor device
12: Silicon substrate
13: Device isolation region
14a: P-well
14b: N-well
15a: High-concentration n-type impurity diffusion region
15b: High-concentration p-type impurity diffusion region
16a: n-type impurity diffusion region
16b: p-type impurity diffusion region
17: Gate oxide film
18: Gate electrode
19: Gate sidewall
21: Insulating film
22: Contact hole
23: Embedded electrode
24: Metal wiring layer
26, 27: Region
31, 91, 111, 116, 121, 131, 139, 181a, 181b: Plasma processing apparatus
32, 92, 115, 119, 122a, 122b, 132: Processing chamber
33: Gas supply unit
34, 97, 105, 124a, 124b, 167a, 167b: Mounting table
35: Microwave generator
36, 125a, 125b: Dielectric window
37: Slot antenna plate
38: Dielectric member
39: Plasma generator device
40: Slot holes
41: Bottom portion
42, 123, 136: Sidewall
43: Exhaust hole
44: Cover
45: O-ring
46, 68, 102, 138, 145: Gas supply holes
47, 180: Upper surface 48, 70, 179: Bottom surface
49: Cylindrical supporting member
51: Matching device
52: Mode converter
53: Waveguide
54: Coaxial waveguide
61: Gas supply device
62, 93, 101, 112, 117, 126, 133, 169, 173: Head unit
63, 94, 113, 118, 170, 174a, 174b: Supporting member
64, 95: End portion
66: Circular plate
67: Extension member
69, 137, 143, 155: Gas supply path
71: Receiving unit
72: Shielding plate
73, 96: Inner wall surface
103, 146: Gas exhaust holes
104, 144, 156: Gas exhaust path
114, 135, 171, 175: Base portion
127: Opening
128a, 128b: Shutter
134, 141: Rod-shaped member
142: Wall
151: Movable part
152: Fixed part
153: Base
154: Rotation central axis
161: Plasma processing system
162a, 162b, 162c: Load ports
163: Load module
164a, 164b: Load-lock modules
165: Transfer module
168a, 168b, 168c, 168d, 168e, 168f, 168g, 168h: Areas
172a, 172b, 172c, 177a, 177b, 177c: Pin holes
176: Mounting unit
178a, 178b: Pins

What is claimed is:
1. A plasma processing apparatus comprising:
a processing chamber for performing therein a plasma process on a target substrate, the processing chamber including a bottom portion positioned at a lower side and a sidewall extended upwards from an outer periphery of the bottom portion and being configured to be airtightly sealed;
a mounting table provided within the processing chamber and configured to hold the target substrate thereon;
a microwave plasma generating device configured to generate microwave plasma within the processing chamber; and
a gas supply device including a head unit configured to move straightly between a first position above the mounting table and a second position different from the first position and to supply a gas, the head unit being configured to supply a film forming gas to a small-volume region formed between the mounting table and the head unit when the head unit is positioned at the first position and to adsorb the film forming gas on the target substrate,
wherein the head unit includes a circular plate having a substantially circular shape,
when the head unit is positioned at the first position, the circular plate covers an upper side of the mounting table,
the head unit is configured to be moved in a horizontal direction, and
the processing chamber is provided with a receiving unit formed by extending a part of the sidewall toward the outside and configured to accommodate therein the head unit at the second station.

2. The plasma processing apparatus of claim 1,
wherein in the gas supply device, the head unit includes gas supply holes formed so as to face the target substrate held on the mounting table and configured to supply the film forming gas when the head unit is positioned at the first position.

3. The plasma processing apparatus of claim 1,
wherein when the head unit is positioned at the first position, a volume of the small-volume region formed between the head unit and the mounting table is about 50% or less of an entire volume of the processing chamber.

4. The plasma processing apparatus of claim 1,
wherein the gas supply device further includes a supporting member that is extended from the sidewall and supports the head unit at a connection portion between an inner end portion of the supporting member and the head unit.

5. The plasma processing apparatus of claim 4,
wherein a temperature control unit is configured to control temperatures of the head unit and the supporting member.

6. The plasma processing apparatus of claim 1,
wherein the mounting table is configured to be moved in at least one of a vertical direction and a horizontal direction.

7. The plasma processing apparatus of claim 1,
wherein the plasma generating device includes:
a microwave generator that generates microwave for plasma excitation; and
a dielectric window that is positioned to face the mounting table and configured to introduce the microwave into the processing chamber.

8. The plasma processing apparatus of claim 7,
wherein the plasma generating device further includes a slot antenna plate having a plurality of slot holes, the slot antenna plate being provided above the dielectric window and configured to radiate the microwave to the dielectric window.

9. A plasma processing apparatus comprising:
a processing chamber for performing therein a plasma process on a target substrate, the processing chamber including a bottom portion positioned at a lower side and a sidewall extended upwards from an outer periphery of the bottom portion and being configured to be airtightly sealed;
a mounting table provided within the processing chamber and configured to hold the target substrate thereon;
a microwave plasma generating device configured to generate microwave plasma within the processing chamber; and
a gas supply device including a head unit configured to move straightly between a first position above the mounting table and a second position different from the first position and to supply a gas, the head unit being configured to supply a film forming gas to a small-volume region formed between the mounting table and the head unit when the head unit is positioned at the first position and to adsorb the film forming gas on the target substrate,
wherein the head unit includes a circular plate having a substantially circular shape, and
wherein the processing chamber is provided with a receiving unit formed by extending a part of the sidewall toward the outside and configured to accommodate therein the head unit at the second station.

10. The plasma processing apparatus of claim 9, further comprising:
a shielding member configured to shield an inner region of the receiving unit from an outer region of the receiving unit.

11. The plasma processing apparatus of claim 10, wherein the shielding member includes a shielding plate capable of moving along an inner wall surface of the sidewall.

12. A gas supply device for supplying a processing gas in a plasma processing apparatus including: a processing chamber for performing therein a plasma process on a target substrate, the processing chamber having a bottom portion positioned at a lower side and a sidewall extended upwards from an outer periphery of the bottom portion and being configured to be airtightly sealed; a mounting table provided within the processing chamber and configured to hold the target substrate thereon; and a microwave plasma generating device configured to generate microwave plasma within the processing chamber, the gas supply device comprising:
a head unit configured to move straightly between a first position above the mounting table and a second position different from the first position and to supply a gas, the head unit being configured to supply a film forming gas to a small-volume region formed between the mounting table and the head unit when the head unit is positioned at the first position and to adsorb the film forming gas on the target substrate,
wherein the head unit includes a circular plate having a substantially circular shape,
when the head unit is positioned at the first position, the circular plate covers an upper side of the mounting table,
the head unit is configured to be moved in a horizontal direction, and
the processing chamber is provided with a receiving unit formed by extending a part of the sidewall toward the outside and configured to accommodate therein the head unit at the second station.

* * * * *

UNITED STATES PATENT AND TRADEMARK OFFICE
CERTIFICATE OF CORRECTION

| | | |
|---|---|---|
| PATENT NO. | : 8,967,082 B2 | Page 1 of 1 |
| APPLICATION NO. | : 13/496540 | |
| DATED | : March 3, 2015 | |
| INVENTOR(S) | : Masahide Iwasaki | |

It is certified that error appears in the above-identified patent and that said Letters Patent is hereby corrected as shown below:

In the specification,

Column 2, line 31 please replace "5" with -- S --

Column 7, line 48 please add -- 22 -- between "holes" and "connected"

Column 8, line 66 please add -- 32 -- between "chamber" and "can"

Column 12, line 16 please add -- 34 -- between "table" and "and"

Signed and Sealed this
Fourteenth Day of July, 2015

Michelle K. Lee
*Director of the United States Patent and Trademark Office*